US012567372B2

(12) United States Patent
Xia et al.

(10) Patent No.: US 12,567,372 B2
(45) Date of Patent: Mar. 3, 2026

(54) ARRAY SUBSTRATE AND DISPLAY PANEL

(71) Applicants:Chongqing BOE Display Technology Co., Ltd., Chongqing (CN); BOE Technology Group Co., Ltd., Beijing (CN); Beijing BOE Technology Development Co., Ltd., Beijing (CN)

(72) Inventors: Weidi Xia, Beijing (CN); Hongtao Weng, Beijing (CN); Xiaoling He, Beijing (CN); Yuanyou Qiu, Beijing (CN); Rui Wang, Beijing (CN); Shuangyuan Zhan, Beijing (CN); Rui Chen, Beijing (CN)

(73) Assignees: CHONGQING BOE DISPLAY TECHNOLOGY CO. , LTD., Chongqing (CN); BOE TECHNOLOGY GROUP CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/992,729

(22) PCT Filed: Aug. 13, 2024

(86) PCT No.: PCT/CN2024/111747
§ 371 (c)(1),
(2) Date: Jan. 9, 2025

(87) PCT Pub. No.: WO2025/066615
PCT Pub. Date: Apr. 3, 2025

(65) Prior Publication Data
US 2025/0391355 A1 Dec. 25, 2025

(30) Foreign Application Priority Data
Sep. 25, 2023 (CN) ......................... 202311244269.X

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC .. G09G 3/3233; H10K 59/131; H10K 59/126; H10K 59/1216; H10K 59/1213
See application file for complete search history.

(56) References Cited

U.S. PATENT DOCUMENTS

2020/0168147 A1 5/2020 Na et al.
2021/0175311 A1* 6/2021 Kwak .................. G09G 3/3233
(Continued)

FOREIGN PATENT DOCUMENTS

CN 110335564 A 10/2019
CN 117082928 A 11/2023

*Primary Examiner* — Kevin M Nguyen
(74) *Attorney, Agent, or Firm* — XSENSUS LLP

(57) ABSTRACT

In an array substrate, a control electrode of a driving transistor, a second electrode of a compensation transistor and a second electrode of a first reset transistor are electrically connected to a first conductive connection portion, and a first electrode of the driving transistor and a second electrode of a data writing transistor are electrically connected to a second conductive connection portion. An orthographic projection of a first conductive portion of the first conductive connection portion overlaps with an orthographic projection of a first scan signal line, and overlaps with an orthographic projection of a second scan signal line. A first shielding layer includes a first shielding pattern; in a thickness direction of the substrate, the first shielding pattern is located between the first scan signal line and the first conductive portion, and/or the first shielding pattern is (Continued)

located between the second scan signal line and the first conductive portion.

20 Claims, 12 Drawing Sheets

(51) Int. Cl.
*H10K 59/126* (2023.01)
*H10K 59/131* (2023.01)

(52) U.S. Cl.
CPC ......... *H10K 59/126* (2023.02); *H10K 59/131* (2023.02); *G09G 2300/0426* (2013.01); *G09G 2310/08* (2013.01); *G09G 2320/0233* (2013.01); *G09G 2330/021* (2013.01)

(56) References Cited

U.S. PATENT DOCUMENTS

2021/0359066 A1 11/2021 An et al.
2023/0165073 A1 5/2023 Choi

* cited by examiner

ARRAY SUBSTRATE AND DISPLAY PANEL

CROSS-REFERENCE TO RELATED APPLICATIONS

This application is a national phase entry under 35 USC 371 of International Patent Application No. PCT/CN2024/111747, filed on Aug. 13, 2024, which claims priority to Chinese Patent Application No. 202311244269.X, filed on Sep. 25, 2023, which are incorporated herein by reference in their entirety.

TECHNICAL FIELD

The present disclosure relates to the field of display technologies, and in particular, to an array substrate and a display panel.

BACKGROUND

An organic light-emitting diode (OLED) display apparatus has become one of the most competitive and promising display apparatuses due to its advantages such as self-luminescence, fast response speed, high brightness, full viewing angle, and flexible display.

SUMMARY

In an aspect, an array substrate is provided. The array substrate includes a substrate and a driving circuit layer located on the substrate. The driving circuit layer includes a plurality of pixel driving circuits, a plurality of first scan signal lines, a plurality of second scan signal lines, and a first shielding layer. The plurality of pixel driving circuits are located on a side of the substrate and are arranged in multiple rows and multiple columns, and a pixel driving circuit includes a first reset transistor, a compensation transistor, a driving transistor, a data writing transistor, a first conductive connection portion and a second conductive connection portion. A control electrode of the driving transistor, a second electrode of the compensation transistor and a second electrode of the first reset transistor are all electrically connected to the first conductive connection portion, and a first electrode of the driving transistor and a second electrode of the data writing transistor are all electrically connected to the second conductive connection portion. The plurality of first scan signal lines are located on the side of the substrate; the plurality of first scan signal lines all extend in a row direction and are arranged in sequence in a column direction, and a first scan signal line is electrically connected to control electrodes of data writing transistors in a row of pixel driving circuits; and an orthographic projection of a first conductive portion of the first conductive connection portion on the substrate overlaps with an orthographic projection of the first scan signal line on the substrate. The plurality of second scan signal lines are located on the side of the substrate; the plurality of second scan signal lines all extend in the row direction and are arranged in sequence in the column direction, and a second scan signal line is electrically connected to control electrodes of compensation transistors in the row of pixel driving circuits; and the orthographic projection of the first conductive portion of the first conductive connection portion on the substrate overlaps with an orthographic projection of the second scan signal line on the substrate. The first shielding layer is configured to have a constant voltage signal, and the first shielding layer includes a first shielding pattern; in a thickness direction of the substrate, the first shielding pattern is located between the first scan signal line and the first conductive portion; and/or in the thickness direction of the substrate, the first shielding pattern is located between the second scan signal line and the first conductive portion.

In some embodiments, the driving circuit layer includes a semiconductor layer, a first gate metal layer, a second gate metal layer and a first wire metal layer that are stacked on the substrate. The semiconductor layer is located on the substrate, and the semiconductor layer includes a first electrode and a second electrode of the first reset transistor, a first electrode and a second electrode of the compensation transistor, a first electrode and a second electrode of the driving transistor, and a first electrode and a second electrode of the data writing transistor. The first gate metal layer is located on a side of the semiconductor layer away from the substrate, and the first gate metal layer includes a control electrode of the first reset transistor, a control electrode of the compensation transistor, a control electrode of the driving transistor, and a control electrode of the data writing transistor. The second gate metal layer is located on a side of the first gate metal layer away from the semiconductor layer. The first wire metal layer is located on a side of the second gate metal layer away from the first gate metal layer, and the first wire metal layer includes the first scan signal line and the second scan signal line.

In some embodiments, the first conductive portion is located in the semiconductor layer; an end of the first conductive portion is electrically connected to the second electrode of the first reset transistor, and another end of the first conductive portion is electrically connected to the control electrode of the driving transistor and the second electrode of the compensation transistor. The first conductive portion includes a first conductive sub-portion and a second conductive sub-portion that are connected. An orthographic projection of the first conductive sub-portion on the substrate overlaps with the orthographic projection of the first scan signal line on the substrate, and the orthographic projection of the first conductive sub-portion on the substrate is within borders of an orthographic projection of the first shielding pattern on the substrate; and/or an orthographic projection of the second conductive sub-portion on the substrate overlaps with the orthographic projection of the second scan signal line on the substrate, and the orthographic projection of the second conductive sub-portion on the substrate is within the borders of the orthographic projection of the first shielding pattern on the substrate.

In some embodiments, the first conductive portion further includes a third conductive sub-portion. An end of the third conductive sub-portion is electrically connected to the first conductive sub-portion, and another end of the third conductive sub-portion is electrically connected to the second conductive sub-portion. An orthographic projection of the third conductive sub-portion on the substrate is within the borders of the orthographic projection of the first shielding pattern on the substrate.

In some embodiments, in the column direction, the first shielding pattern includes a first edge and a second edge, and the first edge is located on a side of the second edge away from the driving transistor. A first minimum distance between an orthographic projection of the first edge on the substrate and an orthographic projection of a side of the first conductive sub-portion away from the second conductive sub-portion on the substrate is greater than or equal to 1 $\mu$m; and/or a second minimum distance between an orthographic projection of the second edge on the substrate and an orthographic projection of a side of the second conductive sub-portion away from the first conductive sub-portion on the substrate is greater than or equal to 1 µm.

In some embodiments, in the row direction, a third minimum distance between a border of the orthographic projection of the first shielding pattern on the substrate and a border of the orthographic projection of the first conductive sub-portion on the substrate is greater than or equal to 1 µm; and/or in the row direction, a fourth minimum distance between a border of the orthographic projection of the first shielding pattern on the substrate and a border of the orthographic projection of the second conductive sub-portion on the substrate is greater than or equal to 1 µm.

In some embodiments, the first shielding pattern includes a first shielding sub-portion extending in the row direction and a second shielding sub-portion extending in the column direction. An orthographic projection of the first shielding sub-portion on the substrate overlaps with the orthographic projection of the second scan signal line on the substrate, and an orthographic projection of the second shielding sub-portion on the substrate overlaps with an orthographic projection of the first conductive portion of the first conductive connection portion on the substrate.

In some embodiments, in the column direction, the first reset transistor is located on a side of the first scan signal line away from the second scan signal line. An orthographic projection of the first shielding pattern on the substrate is non-overlapping with an orthographic projection of the first reset transistor on the substrate.

In some embodiments, the pixel driving circuit further includes a storage capacitor, and the storage capacitor includes a first electrode plate and a second electrode plate. The first electrode plate of the storage capacitor is electrically connected to the first conductive connection portion, and the second electrode plate of the storage capacitor is electrically connected to a first power supply signal line. The first power supply signal line is configured to provide a first power supply signal, and the first power supply signal is a constant voltage signal. In a case where the driving circuit layer includes the first gate metal layer and the second gate metal layer, the first gate metal layer further includes the first electrode plate of the storage capacitor, and the first electrode plate of the storage capacitor is also used as the control electrode of the driving transistor. The second gate metal layer includes the second electrode plate of the storage capacitor, and the first shielding layer is electrically connected to the second electrode plate of the storage capacitor.

In some embodiments, the first shielding layer and the second electrode plate of the storage capacitor are in the same layer.

In some embodiments, the second gate metal layer further includes a first auxiliary connection portion. An end of the first auxiliary connection portion is electrically connected to the second electrode plate of the storage capacitor, and another end of the first auxiliary connection portion is electrically connected to the first shielding pattern. An orthographic projection of the first auxiliary connection portion on the substrate is non-overlapping with an orthographic projection of a control electrode of the compensation transistor on the substrate.

In some embodiments, the orthographic projection of the first auxiliary connection portion on the substrate is non-overlapping with an orthographic projection of a second electrode of the compensation transistor on the substrate.

In some embodiments, the first shielding layer further includes a second shielding pattern, and an orthographic projection of the second shielding pattern on the substrate overlaps with an orthographic projection of the second conductive connection portion on the substrate.

In some embodiments, the compensation transistor is a dual-gate transistor, and the control electrode of the compensation transistor includes a first control electrode and a second control electrode. In a case where the driving circuit layer includes the first gate metal layer and the semiconductor layer, the first gate metal layer includes a first conductive pattern, and the first conductive pattern includes the first control electrode and the second control electrode of the compensation transistor. The semiconductor layer includes a first channel portion and a second channel portion of the compensation transistor, and the semiconductor layer further includes a second auxiliary connection portion. An end of the second auxiliary connection portion is electrically connected to the first channel portion of the compensation transistor, and another end of the second auxiliary connection portion is electrically connected to the second channel portion of the compensation transistor.

In some embodiments, the first shielding layer further includes a third shielding pattern, and an orthographic projection of the third shielding pattern on the substrate overlaps with an orthographic projection of the second auxiliary connection portion on the substrate.

In some embodiments, the orthographic projection of the third shielding pattern on the substrate is non-overlapping with orthographic projections of the first control electrode and the second control electrode of the compensation transistor on the substrate.

In some embodiments, the first conductive pattern further includes a third auxiliary connection portion, and the third auxiliary connection portion is located on a side of the first control electrode and the second control electrode of the compensation transistor away from the driving transistor. An end of the third auxiliary connection portion is electrically connected to both the first control electrode and the second control electrode of the compensation transistor, and another end of the third auxiliary connection portion is electrically connected to the second scan signal line.

In some embodiments, the pixel driving circuit further includes a first light-emitting control transistor and a second light-emitting control transistor. A first electrode of the first light-emitting control transistor is electrically connected to a first power supply signal line, a second electrode of the first light-emitting control transistor is electrically connected to the first electrode of the driving transistor, and a control electrode of the first light-emitting control transistor is electrically connected to a first enable signal line. A first electrode of the second light-emitting control transistor is electrically connected to a second electrode of the driving transistor, a second electrode of the second light-emitting control transistor is electrically connected to an output terminal of the pixel driving circuit, and a control electrode of the second light-emitting control transistor is electrically connected to a second enable signal line. In the column direction, the first light-emitting control transistor is located between the driving transistor and the second light-emitting control transistor.

In some embodiments, the array substrate further includes a bottom shielding layer located between the substrate and the pixel driving circuit, and an orthographic projection of the bottom shielding layer on the substrate covers an orthographic projection of the driving transistor on the substrate.

In another aspect, a display panel is provided. The display panel includes the array substrate as described in any one of the above embodiments. The display panel further includes a light-emitting device layer located on a side of the array substrate away from the substrate. The light-emitting device layer includes a plurality of light-emitting devices, and a light-emitting device is electrically connected to the pixel driving circuit.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
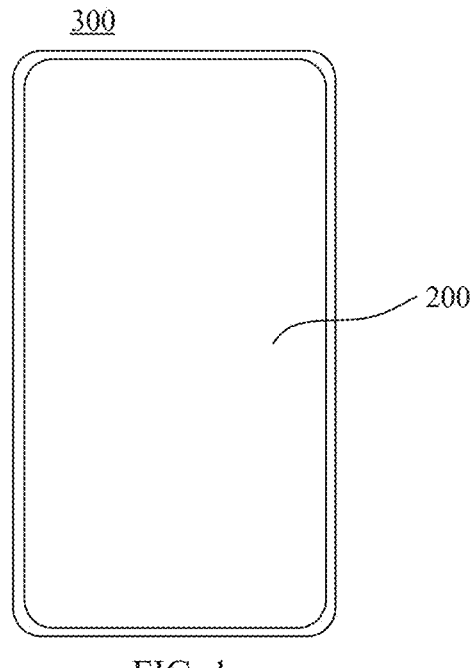
FIG. 1 is a structural diagram of a display apparatus, in accordance with some embodiments.

The technical solutions in some embodiments of the present disclosure will be described clearly and completely with reference to the accompanying drawings; obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a/the plurality of" means two or more unless otherwise specified.

In the description of some embodiments, the term "connected" and extensions thereof may be used. The term "connected" should be understood in a broad sense. For example, the term "connected" can represent a fixed connection, a detachable connection, or a one-piece connection; alternatively, the term "connected" can represent a direct connection, or an indirect connection through an intermediate medium. The embodiments disclosed herein are not necessarily limited to the context herein.

The phrase "at least one of A, B and C" has the same meaning as the phrase "at least one of A, B or C", and they both include following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if", depending on the context, is optionally construed as "when" or "in a case where". Similarly, depending on the context, the phrase "if it is determined" or "if [a stated condition or event] is detected" is optionally construed as "in a case where it is determined".

The phrase "applicable to" or "configured to" as used herein indicates an open and inclusive expression, which does not exclude apparatuses that are applicable to or configured to perform additional tasks or steps.

In addition, the phrase "based on" or "according to" as used herein is meant to be open and inclusive, since a process, step, calculation or other action that is "based on" or "according to" one or more of the stated conditions or values may, in practice, be based on or according to additional conditions or values exceeding those stated.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "parallel", "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism is, for example, a deviation within 5°. The term "perpendicular" includes absolute perpendicularity and approximate perpendicularity, and an acceptable range of deviation of the approximate perpendicularity is also, for example, a deviation within 5°. The term "equal" includes absolute equality and approximate equality, and an acceptable range of deviation of the approximate equality is, for example, that a difference between two equals is less than or equal to 5% of either of the two equals.

It should be understood that, in a case where a layer or element is referred to be on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of the regions in the apparatuses, and are not intended to limit the scope of the exemplary embodiments.

For transistors used in the circuit structure provided in the embodiments of the present disclosure, a first electrode of each transistor is one of a source and a drain, and a second electrode of each transistor is the other of the source and the drain. Since the source and the drain of the transistor may be symmetrical in structure, there may be no difference in structure between the source and the drain of the transistor. That is, there may be no difference in structure between the first electrode and the second electrode of the transistor in the embodiments of the present disclosure.

FIG. 1 is a structural diagram of a display apparatus, in accordance with some embodiments.

As shown in FIG. 1, some embodiments of the present disclosure provide a display apparatus 300, and the display apparatus 300 includes a display panel 200.

For example, the display apparatus 300 further includes a frame and other electronic components.

For example, the display apparatus 300 is an electroluminescent display apparatus or a photoluminescent display apparatus. In a case where the display apparatus is the electroluminescent display apparatus, the electroluminescent display apparatus may be an organic light-emitting diode (OLED) display apparatus or a quantum dot light-emitting diode (QLED) display apparatus. In a case where the display apparatus is the photoluminescent display apparatus, the photoluminescent display apparatus may be a quantum dot photoluminescent display apparatus.

For example, the display apparatus 300 may be any apparatus that displays images whether in motion (e.g., videos) or stationary (e.g., static images), and whether textual or graphical. More specifically, it is expected that the display apparatus in the embodiments may be implemented in or associated with a variety of electronic apparatuses. The variety of electronic apparatuses include (but are not limited to), for example, mobile phones, wireless apparatuses, personal digital assistants (PDAs), hand-held or portable computers, global positioning system (GPS) receivers/navigators, cameras, MP4 video players, video cameras, game consoles, watches, clocks, calculators, television monitors, flat panel displays, computer monitors, car displays (such as odometer displays), navigators, cockpit controllers and/or displays, camera view displays (such as rear view camera displays in vehicles), electronic photos, electronic billboards or indicators, projectors, building structures, packaging and aesthetic structures (such as a display for an image of a piece of jewelry), etc.

Some embodiments of the present disclosure further provide a display panel. The display panel can be used as the display panel in the display apparatus in any one of the above embodiments. Of course, the display panel can also be applied to other display apparatuses, and the present disclosure does not limit this.

Figure 2:
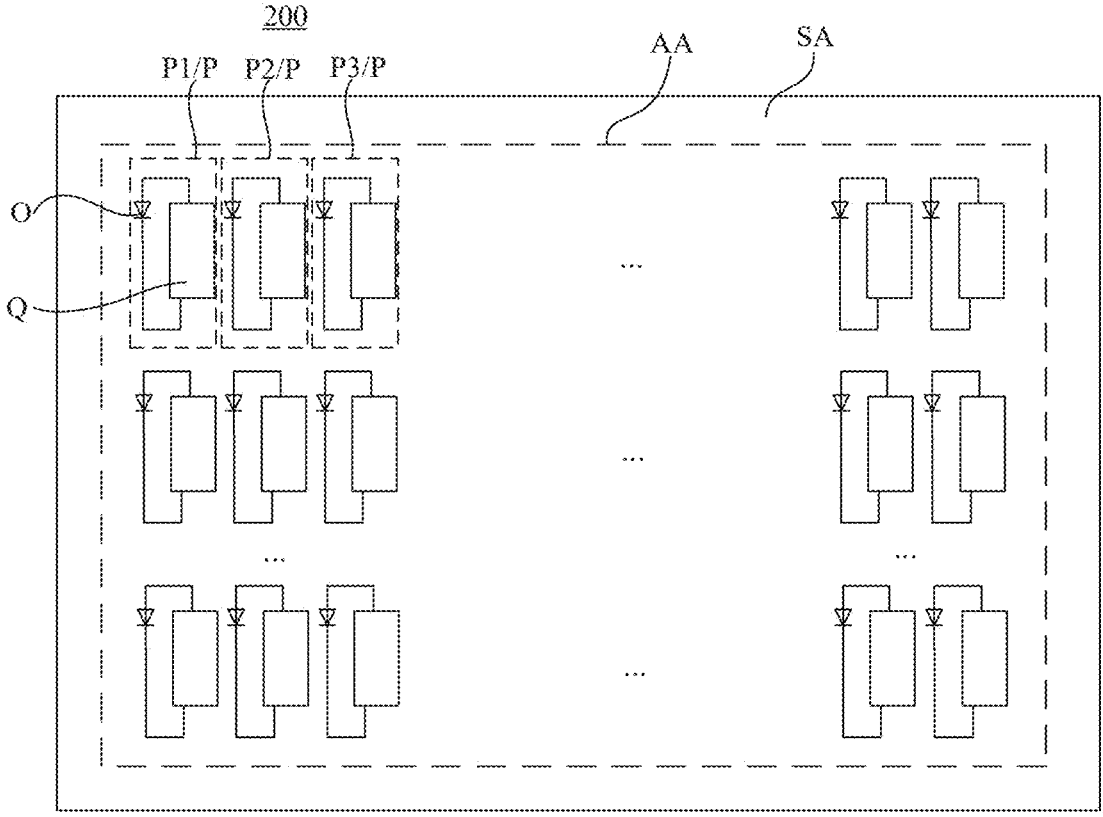
FIG. 2 is a structural diagram of a display panel, in accordance with some embodiments.

FIG. 2 is a structural diagram of a display panel, in accordance with some embodiments. FIG. 2 shows a structure of a display area of the display panel. It should be noted that FIG. 2 only shows the structure of the display area of the display panel, and omits the structure of a peripheral area (for example, omits a scan driving circuit).

In some embodiments, as shown in FIG. 2, the display panel 200 includes the display area (an active area (AA area for short), which is also referred to as an active display area) AA and the peripheral area SA. The peripheral area SA may be located on at least one side (e.g., one side; or four sides, including upper and lower sides and left and right sides) of the display area AA.

The display panel 200 includes a plurality of sub-pixels P disposed in the display area AA. The plurality of sub-pixels P may be arranged in an array. Through the light emitted by the plurality of sub-pixels P, the display panel 200 can display an image in the display area AA.

Specifically, the plurality of sub-pixels P can include sub-pixels that emit light of different colors. For example, the plurality of sub-pixels P include first sub-pixels P1, second sub-pixels P2, and third sub-pixels P3. The first sub-pixel P1, the second sub-pixel P2 and the third sub-pixel P3 emit light of three primary colors, respectively. For example, the first sub-pixel P1 emits red light, the second sub-pixel P2 emits green light, and the third sub-pixel P3 emits blue light.

Based on this, by adjusting brightnesses (gray scales) of sub-pixels P of different colors, display of multiple colors may be achieved through color combination and superposition, thereby achieving full-color display of the display panel 200.

As shown in FIG. 2, a sub-pixel P can include a light-emitting device O and a pixel driving circuit Q coupled to the light-emitting device O.

The light-emitting device O may be an organic light-emitting diode (OLED), a quantum dot light-emitting diode (QLED), a light-emitting diode (LED), or a liquid crystal light-emitting device, which is not limited. The embodiments of the present disclosure do not limit the type of light-emitting device. That is, the light-emitting device O may also be any other light-emitting device (e.g., a light-emitting device that emits light by discharging), as long as it is capable of emitting light to enable the display panel 200 to display images.

The pixel driving circuit Q may be configured to provide an electrical signal (e.g., a driving voltage or a driving current) for the light-emitting device O coupled to the pixel driving circuit Q in response to a received scan signal and a received data signal, so as to drive the light-emitting device O to emit light, thereby enabling the display panel 200 to display images.

Figure 3:
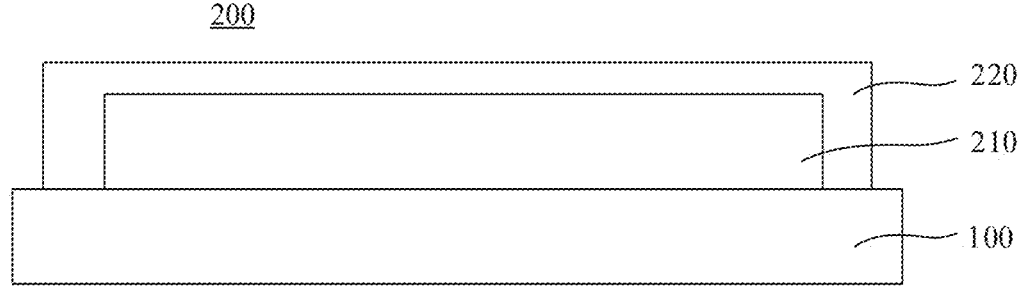
FIG. 3 is sectional view of a display panel, in accordance with some embodiments.

FIG. 3 is sectional view of a display panel, in accordance with some embodiments.

As shown in FIG. 3, the display panel 200 includes an array substrate 100 and a light-emitting device layer 210 that are stacked in sequence. The light-emitting device layer 210 is located on a side of the array substrate 100 close to a light-exit surface of the display panel 200.

The array substrate 100 includes a plurality of pixel driving circuits Q (as shown in FIG. 2), the light-emitting device layer 210 includes a plurality of light-emitting devices O (as shown in FIG. 2), and the plurality of pixel driving circuits Q are electrically connected to the plurality of light-emitting devices O to drive the light-emitting devices O to emit light.

In some examples, the plurality of pixel driving circuits Q are electrically connected to the plurality of light-emitting devices O in one-to-one correspondence. In some other examples, a single pixel driving circuit Q is coupled to multiple light-emitting devices O; or multiple pixel driving circuits Q are coupled to a single light-emitting device O. Hereinafter, a structure of the display panel 200 will be schematically described in the present disclosure by considering an example in which a single pixel driving circuit Q is coupled to a single light-emitting device O.

In some examples, the light-emitting device layer 210 includes an anode layer, a light-emitting functional layer, and a cathode layer that are stacked in sequence. The light-emitting functional layer includes a light-emitting layer.

In some other examples, in addition to the light-emitting layer, the light-emitting functional layer further includes one or more of an electron transport layer (ETL), an electron injection layer (EIL), a hole transport layer (HTL) and a hole injection layer (HIL).

In some examples, the display panel 200 further includes an encapsulation layer 220 located on a side of the light-emitting device layer 210 away from the array substrate 100. Here, the encapsulation layer 220 may be an encapsulation film or an encapsulation substrate.

The encapsulation layer 220 can cover the plurality of light-emitting devices O in the light-emitting device layer 210 to wrap the light-emitting devices O, which prevents a service life of the display panel 200 from being shortened due to water vapor and oxygen in an external environment entering the display panel 200 and damaging an organic material of the light-emitting devices O.

Some embodiments of the present disclosure further provide an array substrate. The array substrate can be used as the array substrate in the display panel provided in any one of the above embodiments. Of course, the array substrate can also be applied to any other display panel, and the present disclosure does not limit this.

Figure 4:
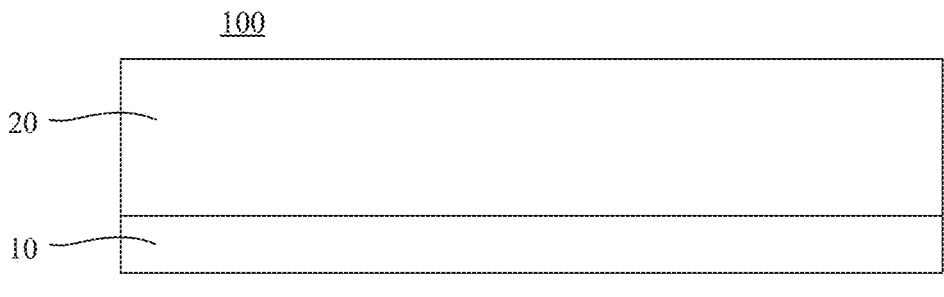
FIG. 4 is a sectional view of an array substrate, in accordance with some embodiments.
Figure 5:
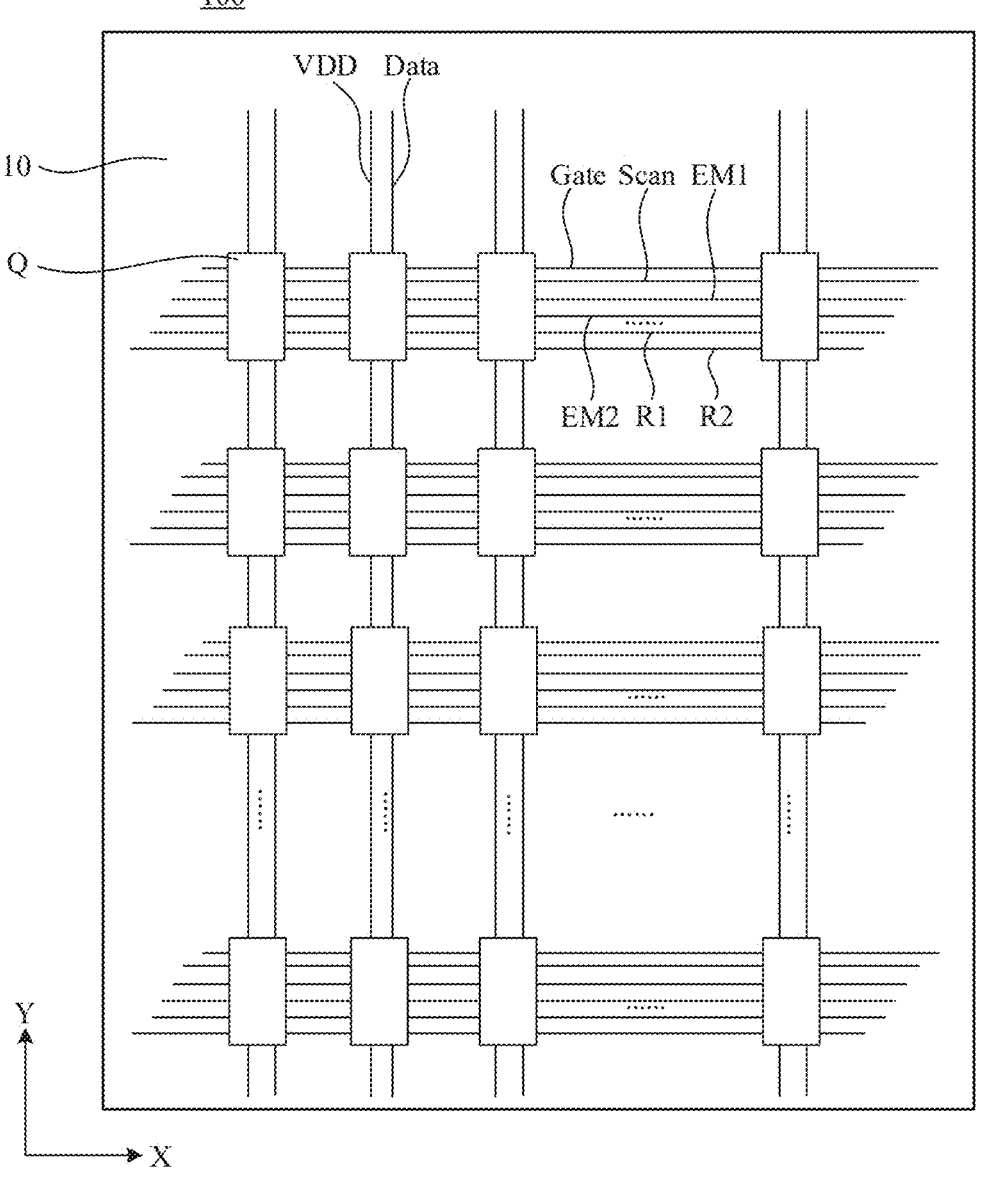
FIG. 5 is a structural diagram of an array substrate, in accordance with some embodiments.

FIG. 4 is a sectional view of an array substrate, in accordance with some embodiments; and FIG. 5 is a structural diagram of an array substrate, in accordance with some embodiments. FIG. 5 shows a structure of the display area of the array substrate. It should be noted that FIG. 5 only shows the structure of the display area of the array substrate, while omitting the structure of the peripheral area.

In some embodiments, as shown in FIGS. 4 and 5, the array substrate 100 includes a substrate 10 and a driving circuit layer 20 located on the substrate 10, and the driving circuit layer 20 is located on a side of the substrate 10. For example, the driving circuit layer 20 is located on a side of the substrate 10 close to the light-emitting device layer 210 (as shown in FIG. 3). The driving circuit layer 20 includes a plurality of pixel driving circuits Q (as shown in FIG. 2).

The plurality of pixel driving circuits Q are arranged in multiple rows and multiple columns. For convenience of description, the plurality of pixel driving circuits Q are described in the present disclosure by taking an example in which the plurality of pixel driving circuits Q are arranged in a matrix.

In some examples, the substrate 10 is a flexible substrate. For example, a material of the substrate 10 includes an organic material. For example, the material of the substrate 10 is any one of polyimide (PI), polycarbonate (PC) or polyvinyl chloride (PVC).

In some other examples, the substrate 10 is a rigid substrate. For example, the rigid substrate is a glass substrate or a polymethyl methacrylate (PMMA) substrate.

The driving circuit layer 20 further includes a plurality of signal lines. A single pixel driving circuit Q needs to be electrically connected to multiple signal lines, and thus the multiple signal lines are used to provide different signals for the pixel driving circuit Q.

For example, the plurality of signal lines include: first scan signal lines Gate, second scan signal lines Scan, data signal lines Data, first enable signal lines EM1, second enable signal lines EM2, first reset signal lines R1, second reset signal lines R2, first initialization signal lines Vinit1, second initialization signal lines Vinit2, and first power supply signal lines VDD. The first initialization signal lines Vinit1 and the second initialization signal lines Vinit2 are not shown in FIG. 5.

In some embodiments, the pixel driving circuit Q includes a plurality of transistors. In some embodiments, a structure of the pixel driving circuit Q varies, which may be set according to actual needs. For example, the pixel driving circuit Q is of a structure with "7T1C", "8T1C", or the like. Here, "T" represents a transistor, a number before "T" represents the number of transistors, "C" represents a storage capacitor, and a number before "C" represents the number of storage capacitors. The following will be described by considering the pixel driving circuit with the structure of "7T1C" as an example.

Figure 6:
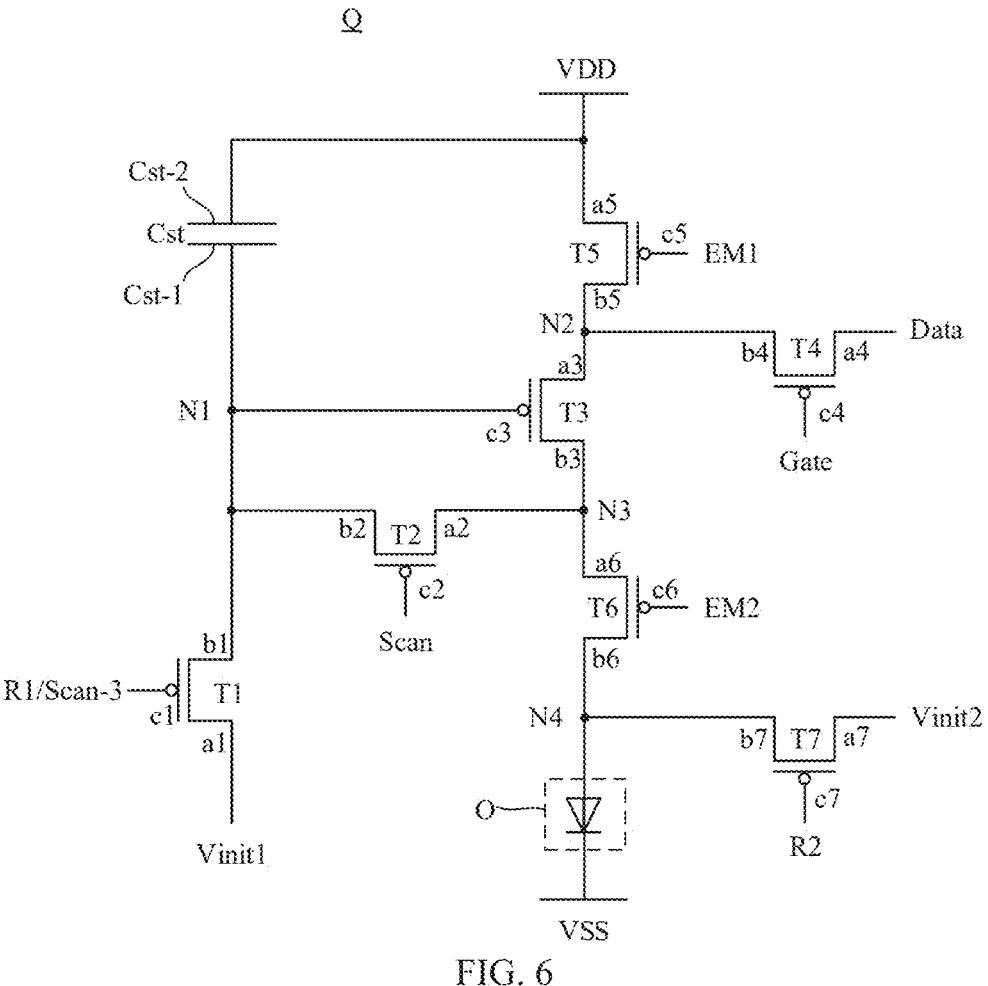
FIG. 6 is an equivalent circuit diagram of a pixel driving circuit, in accordance with some embodiments.

FIG. 6 is an equivalent circuit diagram of a pixel driving circuit, in accordance with some embodiments. FIG. 6 shows an equivalent circuit diagram of the pixel driving circuit with the structure of "7T1C".

As shown in FIG. 6, the pixel driving circuit Q may be a pixel driving circuit Q with the structure of "7T1C". The pixel driving circuit Q includes a first reset transistor T1, a compensation transistor T2, a driving transistor T3, a data writing transistor T4, a first light-emitting control transistor T5, a second light-emitting control transistor T6, a second reset transistor T7, and a storage capacitor Cst.

Since the pixel driving circuit Q needs to be electrically connected to different types of signal lines, a variety of signal lines are also illustrated in FIG. 5.

A control electrode c1 of the first reset transistor T1 is electrically connected to a first reset signal line R1, a first electrode a1 of the first reset transistor T1 is electrically connected to a first initialization signal line Vinit1, and a second electrode b1 of the first reset transistor T1 is electrically connected to a first node N1.

A control electrode c2 of the compensation transistor T2 is electrically connected to a second scan signal line Scan, a first electrode a2 of the compensation transistor T2 is electrically connected to a third node N3, and a second electrode b2 of the compensation transistor T2 is electrically connected to the first node N1.

In some examples, a second scan signal line Scan for driving an nth row of pixel driving circuits Q is also used as the first reset signal line R1 of an (n+3)th row of pixel driving circuits Q. Based on this, when the second scan signal line Scan drives the compensation transistors T2 in the nth row of pixel driving circuits Q to be turned on, the second scan signal line Scan can also drive the first reset transistors T1 in the (n+3)th row of pixel driving circuits Q to be turned on, so as to reset the first node N1.

In other words, the nth row of pixel driving circuits Q can be driven by the second scan signal line Scan for driving an (n−3)th row of pixel driving circuits Q. In FIG. 6, "Scan-3" indicates the second scan signal line Scan electrically connected to a third row of pixel driving circuits Q that is before the pixel driving circuit Q.

For example, the second scan signal line Scan for driving the nth row of pixel driving circuits Q includes two branches, which are a first branch and a second branch. The first branch of the second scan signal line Scan for the nth row of pixel driving circuits Q is electrically connected to the nth row of pixel driving circuits Q to drive the compensation transistors T2 in the nth row of pixel driving circuits Q to be turned on. The second branch of the second scan signal line Scan for the nth row of pixel driving circuits Q is electrically connected to the (n+3)th row of pixel driving circuits Q to drive the first reset transistors T1 in the (n+3)th row of pixel driving circuits Q to be turned on, so as to reset the first node N1.

Based on this, there is no need to provide a separate first reset signal line R1, which may reduce the number of wires in the array substrate 100, and facilitate the layout of other wires in the array substrate 100.

A control electrode c3 of the driving transistor T3 is electrically connected to the first node N1, a first electrode a3 of the driving transistor T3 is electrically connected to a second node N2, and a second electrode b3 of the driving transistor T3 is electrically connected to the third node N3.

A control electrode c4 of the data writing transistor T4 is electrically connected to a first scan signal line Gate, a first electrode a4 of the data writing transistor T4 is electrically connected to a data signal line Data, and a second electrode b4 of the data writing transistor T4 is electrically connected to the second node N2.

A control electrode c5 of the first light-emitting control transistor T5 is electrically connected to a first enable signal line EM1, a first electrode a5 of the first light-emitting control transistor T5 is electrically connected to a first power supply signal line VDD, and a second electrode b5 of the first light-emitting control transistor T5 is electrically connected to the second node N2.

A control electrode c6 of the second light-emitting control transistor T6 is electrically connected to a second enable signal line EM2, a first electrode a6 of the second light-emitting control transistor T6 is electrically connected to the third node N3, and a second electrode b6 of the second light-emitting control transistor T6 is electrically connected to a fourth node N4; and the fourth node N4 is electrically connected to an anode of the light-emitting device O. A cathode of the light-emitting device O is electrically connected to a second power supply signal line VSS. A voltage of a second power supply signal provided by the second power supply signal line VSS is less than a voltage of a first power supply signal provided by the first power supply signal line VDD.

A control electrode c7 of the second reset transistor T7 is electrically connected to a second reset signal line R2, a first electrode a7 of the second reset transistor T7 is electrically connected to a second initialization signal line Vinit2, and a second electrode b7 of the second reset transistor T7 is electrically connected to the fourth node N4; and the fourth node N4 is electrically connected to the anode of the light-emitting device O.

A first electrode plate Cst-1 of the storage capacitor Cst is electrically connected to the control electrode c1 of the driving transistor T3, and a second electrode plate Cst-2 of the storage capacitor Cst is electrically connected to the first power supply signal line VDD.

Figure 7:
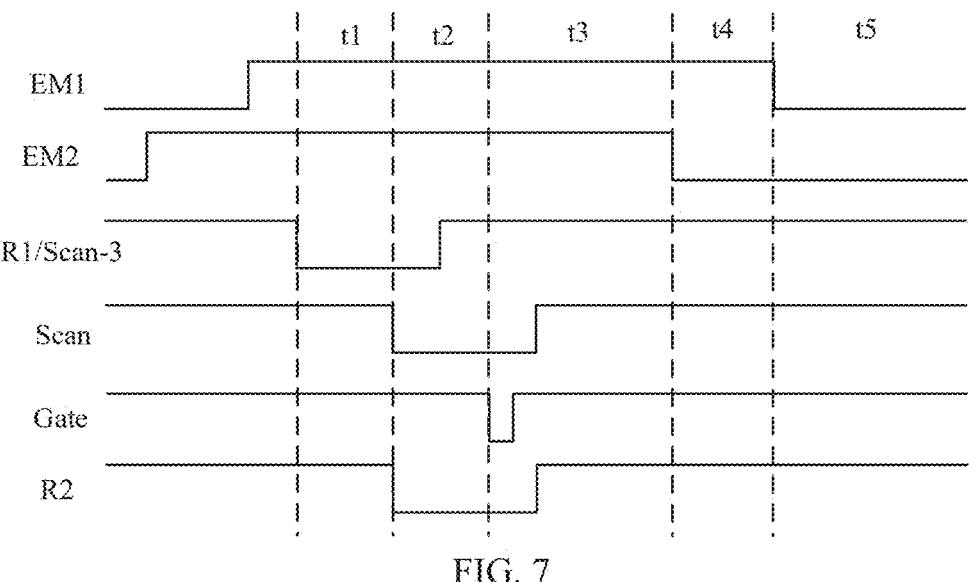
FIG. 7 is a timing diagram of a pixel driving circuit, in accordance with some embodiments.

FIG. 7 is a timing diagram of a pixel driving circuit, in accordance with some embodiments.

In some embodiments, as shown in FIG. 7, a driving process for the pixel driving circuit Q shown in FIG. 6 is as follows: a single frame period includes a first stage t1, a second stage t2, a third stage t3, a fourth stage t4 and a fifth stage t5.

In the first stage t1, a first reset signal provided by the first reset signal line (i.e., the second scan signal line Scan-3 electrically connected to the third row of pixel driving circuits Q before the current pixel driving circuit Q) includes a working level of the first reset transistor T1, which can control the first reset transistor T1 to be turned on; and a first initialization signal transmitted by the first initialization signal line Vinit1 is transmitted to the first node N1 to reset the first node N1. Thus, the stability of the driving transistor T3 included in the pixel driving circuit may be improved.

In the second stage t2, a second reset signal provided by the second reset signal line R2 includes a working level of the second reset transistor T7, which can control the second reset transistor T7 to be turned on; and a second initialization signal transmitted by the second initialization signal line Vinit2 is transmitted to the fourth node N4, which is equivalent to resetting the anode of the light-emitting device O. Thus, the stability of the light-emitting device O is improved.

The first reset signal provided by the first reset signal line (i.e., the second scan signal line Scan-3 electrically connected to the third row of pixel driving circuits Q before the current pixel driving circuit Q) controls the first reset transistor T1 to be continuously turned on. At this time, a voltage of the first node N1 can control the driving transistor T3 to be turned on.

A second scan signal provided by the second scan signal line Scan includes a working level of the compensation transistor T2, which controls the compensation transistor T2 to be turned on; and the voltage at the first node N1 can be transmitted to the third node N3 to reset the third node N3. Thus, the stability of the driving transistor T3 included in the pixel driving circuit Q may be improved.

In a case where the compensation transistor T2 and the driving transistor T3 are both turned on, the first initialization signal provided by the first initialization signal line Vinit1 can be written to the second node N2 through the first reset transistor T1 and the driving transistor T3, so as to reset the second node N2.

Based on this, in the second stage t2, the first node N1, the second node N2 and the third node N3 are reset (that is, the control electrode c3, the first electrode a3 and the second electrode b3 of the driving transistor T3 are reset), so that an initial state of the driving transistor T3 before the third stage t3 (data writing stage) is fixed. Thus, it is convenient for making the driving transistor T3 in a stable state in the third stage t3, which greatly improving the hysteresis effect of the driving transistor T3.

In the third stage t3, a first scan signal provided by the first scan signal line Gate includes a working level of the data writing transistor T4, which can control the data writing transistor T4 to be turned on. The second scan signal provided by the second scan signal line Scan controls the compensation transistor T2 to be continuously turned on. At this time, a data writing signal provided by the data signal line Data can be transmitted to the first node N1 through the data writing transistor T4, the driving transistor T3, and the compensation transistor T2 in sequence, so as to compensate the first node N1; and the voltage of the first node N1 gradually rises to Vdata+Vth.

Vdata is a voltage value of the data writing signal provided by the data signal line Data, and Vth is a threshold voltage of the driving transistor T3 in the pixel driving circuit. When the voltage of the first node N1 is Vdata+Vth, the charging process is completed. Subsequently, the storage capacitor Cst is discharged to keep the driving transistor T3 included in the pixel driving circuit continuously turned on, which ensures that the light-emitting device O emits light.

In the fourth stage t4, a first enable signal provided by the first enable signal line EM1 includes a working level of the first light-emitting control transistor T5, which can control the first light-emitting control transistor T5 to be turned on; and by cooperating with the driving transistor T3, the first power supply signal provided by the first power supply signal line VDD is transmitted to the third node N3 through the driving transistor T3.

In the fifth stage t5, the first enable signal provided by the first enable signal line EM1 controls the first light-emitting control transistor T5 to be continuously turned on; a second enable signal provided by the second enable signal line EM2 includes a working level of the second light-emitting control transistor T6, which can control the second light-emitting control transistor T6 to be turned on; and the first power supply signal, provided by the first power supply signal line VDD, received at the third node N3 is transmitted to the fourth node N4. That is, the first power supply signal provided by the first power supply signal line VDD is transmitted to the anode of the light-emitting device O.

Based on this, in the fifth stage t5, the constant voltage power supply signal provided by the first power supply signal line VDD can flow through the first light-emitting control transistor T5, the driving transistor T3, and the second light-emitting control transistor T6 in sequence to the anode of the light-emitting device O, and the cathode of the light-emitting device O can be electrically connected to the second power supply signal line VSS, thereby driving the light-emitting device O to emit light. The first power supply signal line VDD may be a high power supply signal line, and the second power supply signal line VSS may be a low power supply signal line.

It should be noted that, the "working level" refers to a level that enables the operated transistor included in the pixel driving circuit to be turned on; and accordingly, the "non-working level" refers to a level that does not enable the operated transistor included in the pixel driving circuit to be turned on (i.e., enables the transistor to be turned off). Depending on factors such as the type (N-type or P-type) of transistors in the circuit structure of the pixel driving circuit, the working level may be higher or lower than the non-working level. Generally, for a square wave pulse signal used by the pixel driving circuit during working, the working level corresponds to a level of a square wave pulse portion of the square wave pulse signal, while the non-working level corresponds to a level of a non-square wave pulse portion.

In addition, in some embodiments, the first power supply signal line VDD is configured to transmit a direct-current high-level signal (which is, for example, lower than or equal to a high-level portion of a clock signal). Here, the direct-current high-level signal is referred to as the first power supply signal, which is the same in the following embodiments and will not be repeated here.

In some embodiments, the first power supply signal line VDD is configured to transmit a direct-current high-level signal (which is, for example, higher than or equal to the high-level portion of the clock signal). Here, the direct-current high-level signal is referred to as a first voltage signal.

The second power supply signal line VSS is configured to transmit a direct-current low-level signal (which is, for example, lower than or equal to a low-level portion of a clock signal). Here, the direct-current low-level signal is referred to as the second power supply signal, which is the same in the following embodiments and will not be repeated here.

For example, the voltage value of the first power supply signal is greater than that of the second power supply signal, which is the same in the following embodiments and will not be repeated here.

In some examples, as shown in FIG. 6, the seven transistors in the pixel driving circuit Q are all P-type transistors.

In the case where the seven transistors are all P-type transistors, the above "working level" can be understood as a low-level signal. That is, the seven transistors can all be turned on under control of a low-level signal.

In some examples, as shown in FIG. 6, the seven transistors are all low temperature polysilicon (LTPS) transistors.

In some other examples, the first reset transistor T1 and the compensation transistor T2 are N-type transistors. The N-type transistor may help reduce the risk of transistor leakage current. That is, it is beneficial to reduce the risk of leakage current of the first reset transistor T1 and the compensation transistor T2, and to ensure the stability of the voltage of the first node N1 (i.e., ensure the stability of the driving transistor T3), thereby improving the brightness maintenance rate of the light-emitting device O within a frame.

In the case where the first reset transistor T1 and the compensation transistor T2 are N-type transistors, the above "working level" can be understood as a high-level signal. That is, the first reset transistor T1 and the compensation transistor T2 can be turned on under the control of the high-level signal.

In some examples, the first reset transistor T1 and the compensation transistor T2 are indium gallium zinc oxide (IGZO) transistors. Oxide transistors have a small off leakage current, thereby reducing the leakage current from the first node N1 to the first reset transistor T1 in the fourth and fifth stages.

In some other embodiments, the pixel driving circuit Q is a pixel driving circuit Q with the structure of "8T1C". In this case, the pixel driving circuit Q further includes a third reset transistor. A control electrode of the third reset transistor is electrically connected to a third reset signal line, a first electrode of the third reset transistor is electrically connected to a third initialization signal line, and a second electrode of the third reset transistor is electrically connected to the second node.

The second node N2 may be reset using a third initialization signal provided by the third initialization signal line, which is equivalent to resetting the first electrode of the driving transistor T3, thereby improving the stability of the driving transistor T3.

In some embodiments, the pixel driving circuit Q further includes a plurality of conductive connection portions. Regardless of whether it is the "7T1C" pixel driving circuit or the "8T1C" pixel driving circuit in the above embodiments, each node represents a node equivalent to a junction point of related couplings in the circuit diagram. Each node corresponds to a conductive connection portion, and the conductive connection portion is used to electrically connect other structure(s) in the circuit to achieve the function of the node.

For example, a plurality of conductive connection portions include a first conductive connection portion and a second conductive connection portion. The first conductive connection portion may be the first node N1 in the equivalent circuit diagram of the pixel driving circuit Q (as shown in FIG. 6), and the second conductive connection portion may be the second node N2 in the equivalent circuit diagram of the pixel driving circuit Q (as shown in FIG. 6).

Based on this, the first conductive connection portion is electrically connected to the control electrode c3 of the driving transistor T3, the second electrode b2 of the compensation transistor T2, the second electrode b1 of the first reset transistor T1, and the first electrode plate Cst-1 of the storage capacitor Cst. The second conductive connection portion is electrically connected to the first electrode a3 of the driving transistor T3, the second electrode b4 of the data writing transistor T4, and the second electrode b5 of the first light-emitting control transistor T5.

It should be noted that a first conductive portion of the first conductive connection portion can be understood as a structure between the second electrode b2 of the compensation transistor T2 and the second electrode b1 of the first reset transistor T1 in a semiconductor layer POLY. The second conductive connection portion can include: a structure between the first electrode a3 of the driving transistor T3 and the second electrode b5 of the first light-emitting control transistor T5, and a structure between the first electrode a3 of the driving transistor T3 and the second electrode b4 of the data writing transistor T4, which are in the semiconductor layer POLY.

Figure 8:
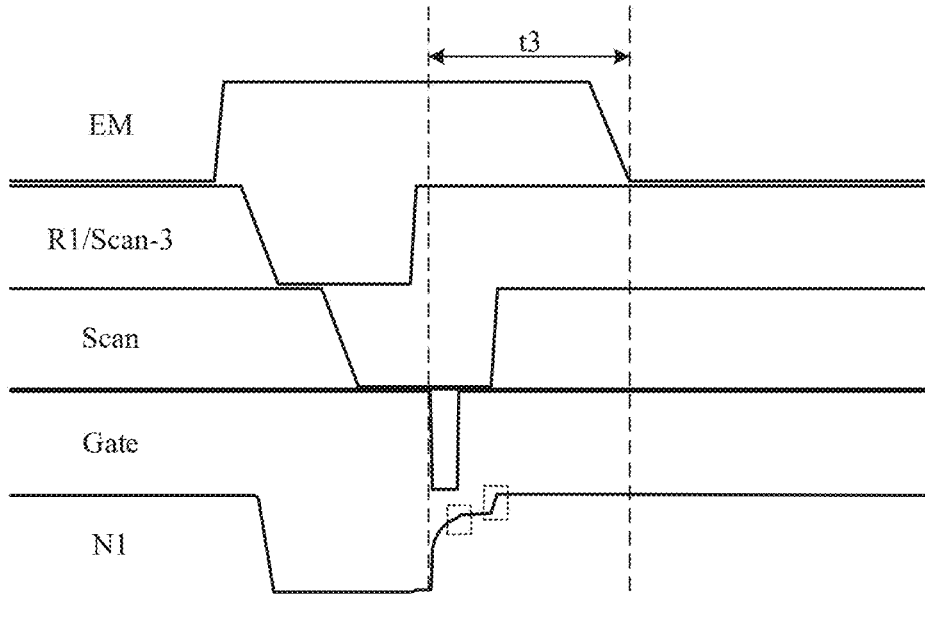
FIG. 8 is a measured timing diagram of a pixel driving circuit, in accordance with some possible implementations.

FIG. 8 is a measured timing diagram of a pixel driving circuit, in accordance with some possible implementations.

The inventors have found that, as shown in FIG. 8, in the test of an actual product, the voltage of the first node N1 is affected when voltages of signals transmitted by the first scan signal line Gate and the second scan signal line Scan jump.

Specifically, in the third stage t3 (data writing stage), the first scan signal provided by the first scan signal line Gate jumps from a low voltage to a high voltage. The jump of the first scan signal raises the voltage of the first node N1, which will reduce the driving signal output by the pixel driving circuit Q to the light-emitting device O, affecting the brightness uniformity of the display panel 200 including the array substrate 100 (as shown in FIG. 3). Furthermore, the second scan signal provided by the second scan signal line Scan also jumps from a low voltage to a high voltage. The jump of the second scan signal also raises the voltage of the first node N1. Thus, it will affect the voltage of the control electrode of the driving transistor T3 and the stability of the driving transistor T3, thereby affecting the driving signal output by the pixel driving circuit Q to the light-emitting device O and affecting the brightness uniformity of the display panel 200 including the array substrate 100.

Furthermore, the voltage jumps of the signals transmitted by the first scan signal line Gate and the second scan signal line Scan both pull the voltage of the first node N1, which aggravates the influence on the stability of the driving transistor T3 and reduces the brightness uniformity of the display panel 200.

The inventors have further found that when the array substrate is manufactured, due to the space limitation of the array substrate 100, an orthographic projection of the first scan signal line Gate on the substrate 10 overlaps with an orthographic projection of the first conductive portion of the first conductive connection portion on the substrate 10, and an orthographic projection of the second scan signal line Scan on the substrate 10 overlaps with the orthographic projection of the first conductive portion of the first conductive connection portion on the substrate 10.

Based on this, a parasitic capacitance is formed between the first scan signal line Gate and the first conductive portion of the first conductive connection portion, and a parasitic capacitance is formed between the second scan signal line Scan and the first conductive portion of the first conductive connection portion. Thus, when the voltages of the signals transmitted by the first scan signal line Gate and the second scan signal line Scan jump, the voltage of the first conductive portion of the first conductive connection portion is pulled accordingly due to the effect of capacitive coupling.

In summary, since the first scan signal line Gate and the second scan signal line Scan have overlapping regions with the first conductive connection portion, the signal jump will affect the voltage of the control electrode of the driving transistor, thereby affecting the stability of the driving transistor T3, affecting the driving signal output by the pixel driving circuit Q to the light-emitting device O, and affecting the brightness uniformity of the display panel 200.

Figure 9:
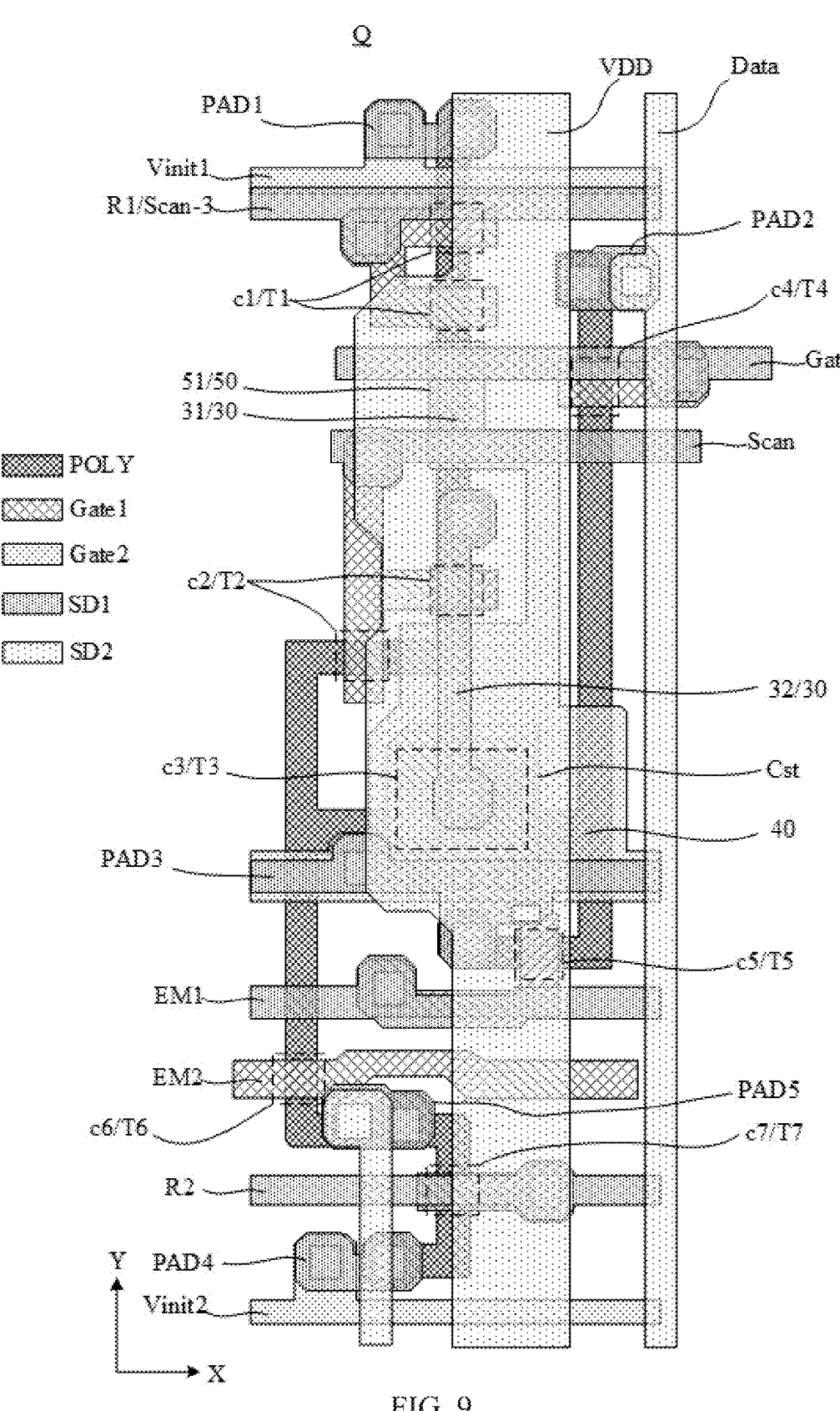
FIG. 9 is a diagram showing film layers of a pixel driving circuit, in accordance with some embodiments.

FIG. 9 is a diagram showing film layers of a pixel driving circuit, in accordance with some embodiments. In FIG. 9, only the control electrode of each transistor is marked to indicate a corresponding transistor, but it does not mean that the transistor only includes the control electrode.

Based on this, as shown in FIG. 9, in the array substrate 100 provided in the embodiments of the present disclosure, a first shielding layer 50 is further included, and the first shielding layer 50 is configured to have a constant voltage signal. The first shielding layer 50 includes a first shielding pattern 51. In a thickness direction of the substrate 10, the first shielding pattern 51 is located between the first scan signal line Gate and the first conductive portion 31 of the first conductive connection portion 30; and/or in the thickness direction of the substrate 10, the first shielding pattern 51 is located between the second scan signal line Scan and the first conductive portion 31 of the first conductive connection portion 30. The thickness direction of the substrate 10 is substantially perpendicular to a row direction X, and the thickness direction of the substrate 10 is substantially perpendicular to a column direction Y.

As shown in the above structure, for the position of the first shielding pattern 51, there are the following three situations.

In the first situation, in the thickness direction of the substrate 10, the first shielding pattern 51 is located between the first scan signal line Gate and the first conductive portion 31 of the first conductive connection portion 30. That is, orthographic projections of the first shielding pattern 51, the first conductive portion 31 of the first conductive connection portion 30, and the first scan signal line Gate on the substrate 10 have an overlapping region.

With such arrangement, it is equivalent to using the first shielding pattern 51 with the constant voltage signal to isolate the first scan signal line Gate from the first conductive portion 31 of the first conductive connection portion 30, which reduces the parasitic capacitance between the first scan signal line Gate and the first conductive portion 31, thereby reducing the influence of the voltage jump of the first scan signal transmitted on the first scan signal line Gate on the first conductive portion 31, and improving the stability of the first conductive connection portion 30.

In the second situation, in the thickness direction of the substrate 10, the first shielding pattern 51 is located between the second scan signal line Scan and the first conductive portion 31 of the first conductive connection portion 30. That is, orthographic projections of the first shielding pattern 51, the first conductive portion 31 of the first conductive connection portion 30, and the second scan signal line Scan on the substrate 10 have an overlapping region.

With such arrangement, it is equivalent to using the first shielding pattern 51 with the constant voltage signal to isolate the second scan signal line Scan from the first conductive portion 31 of the first conductive connection portion 30, which reduces the parasitic capacitance between the second scan signal line Scan and the first conductive portion 31, thereby reducing the influence of the voltage jump of the second scan signal transmitted on the second scan signal line Scan on the first conductive portion 31, and improving the stability of the first conductive connection portion 30.

In the third situation, in the thickness direction of the substrate 10, the first shielding pattern 51 is located between two scan signal lines (i.e., the first scan signal line Gate and the second scan signal line Scan) and the first conductive portion 31 of the first conductive connection portion 30. That is, orthographic projections of a portion of the first shielding pattern 51, the first conductive portion 31 of the first conductive connection portion 30 and the first scan signal line Gate on the substrate 10 have an overlapping region, and orthographic projections of another portion of the first shielding pattern 51, the first conductive portion 31 of the first conductive connection portion 30 and the second scan signal line Scan on the substrate 10 have an overlapping region.

With such arrangement, it is equivalent to using the first shielding pattern 51 with the constant voltage signal to isolate the two scan signal lines (i.e., the first scan signal line Gate and the second scan signal line Scan) from the first conductive portion 31 of the first conductive connection portion 30. The first shielding pattern 51 may be used to simultaneously reduce the parasitic capacitances of the two scan signal lines and the first conductive portion 31, so as to reduce the influence of the voltage jump of the signals transmitted on the two scan signal lines on the first conductive portion 31, which further improves the stability of the first conductive connection portion 30.

Regardless of any one of the above three situations, the first shielding pattern 51 may be used to play a role in stabilizing the first conductive connection portion 30 (first node N1), thereby ensuring the stability of the driving current output by the driving transistor T3, and helping improve the brightness uniformity of the display panel 200.

It should be noted that, in a case where an included angle between the thickness direction of the substrate 10 and the row direction X is in a range of 90°±5°, it can be considered that the thickness direction of the substrate 10 and the row direction X are perpendicular.

In a case where an included angle between the thickness direction of the substrate 10 and the column direction Y is in a range of 90°±5°, it can be considered that the thickness direction of the substrate 10 and the column direction Y are perpendicular.

Figure 10:
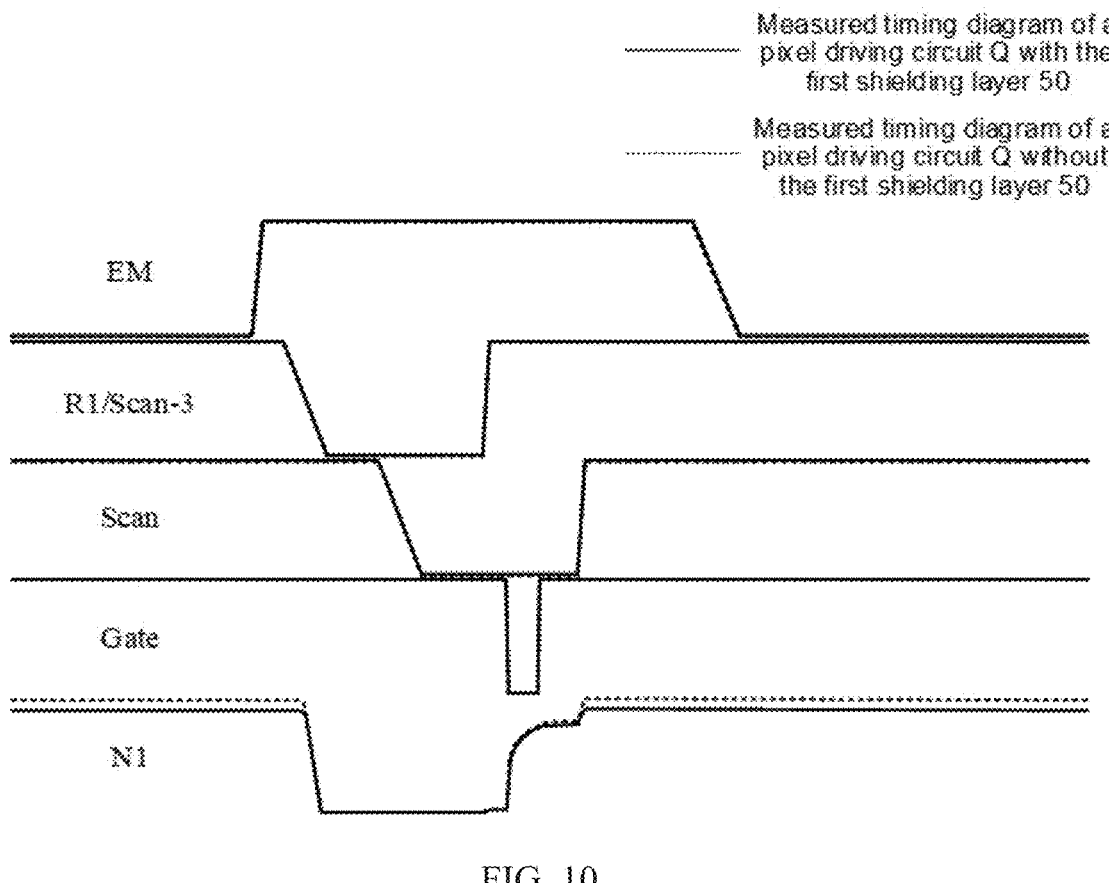
FIG. 10 is a measured timing diagram of a pixel driving circuit, in accordance with some embodiments.

FIG. 10 is a measured timing diagram of a pixel driving circuit, in accordance with some embodiments. FIG. 10 shows a measured timing diagram of a pixel driving circuit Q with the first shielding layer 50 and a measured timing diagram of a pixel driving circuit Q without the first shielding layer 50. Specifically, in FIG. 10, the solid lines represent the measured timing diagram of the pixel driving circuit Q with the first shielding layer 50, and the dotted lines represent the measured timing diagram of the pixel driving circuit Q without the first shielding layer 50.

As shown in FIG. 10, in the test of an actual product, compared to the influence of the signals transmitted by the first scan signal line Gate and the second scan signal line Scan on the voltage of the first node N1 of the pixel driving circuit Q without the first shielding layer 50, the influence of the signals transmitted by the first scan signal line Gate and the second scan signal line Scan on the voltage of the first node N1 of the pixel driving circuit Q with the first shielding layer 50 is reduced.

Specifically, through simulation experiments, it can be known that, in the pixel driving circuit Q without the first shielding layer 50, the capacitance value of the parasitic capacitance between the first conductive connection portion 30 (first node) and the first scan signal line Gate is approximately 0.967 fF, and the capacitance value of the parasitic capacitance between the first conductive connection portion 30 (first node) and the second scan signal line Scan is approximately 3.038 fF. However, in the pixel driving circuit Q with the first shielding layer 50, the capacitance value of the parasitic capacitance between the first conductive connection portion 30 (first node) and the first scan signal line Gate can be reduced to approximately 0.086 fF, and the capacitance value of the parasitic capacitance between the first conductive connection portion 30 (first node) and the second scan signal line Scan can be reduced to approximately 2.06 fF.

The parasitic capacitance between the first conductive connection portion 30 (first node) and the first scan signal line Gate is reduced by approximately 91.1%, and the parasitic capacitance between the first conductive connection portion 30 (first node) and the second scan signal line Scan is reduced by approximately 32.2%. Thus, the parasitic capacitances between the first conductive connection portion 30 (first node) and the two scan signal lines may be significantly reduced, thereby reducing the influence of the two scan signal lines on the first conductive connection portion 30 (first node), and improving the stability of the voltage of the first conductive connection portion 30 (first node).

In summary, in the array substrate 100 provided in some embodiments of the present disclosure, the first shielding layer 50 is added, and the first shielding layer 50 is arranged between the film layer where the first conductive portion 31 of the first conductive connection portion 30 is located and the film layer where the two scan signal lines (the first scan signal line Gate and the second scan signal line Scan) are located. Furthermore, the orthographic projection of the first shielding pattern 51 of the first shielding layer 50 on the substrate 10 overlaps with a first overlapping region, and/or the orthographic projection of the first shielding pattern 51 of the first shielding layer 50 on the substrate 10 overlaps with a second overlapping region. An overlapping region formed by the orthographic projection of the first scan signal line Gate on the substrate 10 and the orthographic projection of the first conductive portion 31 of the first conductive connection portion 30 on the substrate 10 is the first overlapping region. An overlapping region formed by the orthographic projection of the second scan signal line Scan on the substrate 10 and the orthographic projection of the first conductive portion 31 of the first conductive connection portion 30 on the substrate 10 is the second overlapping region.

Based on this, the first shielding pattern 51 is used to isolate at least one of the two scan signal lines from the first conductive portion 31 of the first conductive connection portion 30, so as to reduce the influence of the voltage jump of the signal transmitted on the scan signal line on the first conductive portion 31, which further improves the stability of the first conductive connection portion 30. Thus, the stability of the voltage of the first node N1 in the pixel driving circuit Q may be better improved, thereby ensuring the stability of the driving current output by the driving transistor T3, and helping improve the brightness uniformity of the display panel 200.

The above embodiments mainly introduce how to improve the stability of the voltage of the first node N1 (as shown in FIG. 6) by using the first shielding pattern 51. The following first introduces the position arrangement of the transistors in the pixel driving circuit Q, and then introduces the specific structure of the first shielding pattern 51.

In some examples, as shown in FIG. 9, in the column direction Y, the first reset transistor T1, the data writing transistor T4, and the compensation transistor T2 are located on the same side of the driving transistor T3, and the first light-emitting control transistor T5, the second light-emitting control transistor T6, and the second reset transistor T7 are located on the other side of the driving transistor T3.

In the column direction Y, the compensation transistor T2 is located between the first reset transistor T1 and the driving transistor T3. In the row direction X, the data writing transistor T4 overlaps with the first conductive connection portion 30.

In the column direction Y, the first light-emitting control transistor T5, the second light-emitting control transistor T6 and the second reset transistor T7 are arranged away from the driving transistor T3 in sequence, and the first light-emitting control transistor T5 is adjacent to the driving transistor T3. Since the first electrode plate Cst-1 of the storage capacitor Cst is also used as the control electrode c3 of the driving transistor T3, by arranging the first light-emitting control transistor T5 adjacent to the driving transistor T3, it may be possible to facilitate the electrical connection between the first electrode a5 of the first light-emitting control transistor T5 and the second electrode plate Cst-2 of the storage capacitor, thereby achieving the electrical connection between the first electrode a5 of the first light-emitting control transistor T5 and the first power supply signal line VDD.

The second light-emitting control transistor T6 is located between the first light-emitting control transistor T5 and the second reset transistor T7, so that the second light-emitting control transistor T6 may be closer to the driving transistor T3 than the second reset transistor T7, thereby facilitating the electrical connection between the first electrode a6 of the second light-emitting control transistor T6 and the second electrode b3 of the driving transistor T3.

In addition, the second light-emitting control transistor T6 and the second reset transistor T7 may be arranged adjacent to each other to facilitate the electrical connection between the second electrode b6 of the second light-emitting control transistor T6 and the second electrode b7 of the second reset transistor T7.

Based on the above arrangement, it helps simplify the layout of the array substrate 100, and prevents the problem of short circuit caused by the need of the conductive portions in the array substrate 100 to bypass wires.

Next, the arrangement of the film layers in the array substrate 100 is introduced.

Figure 11:
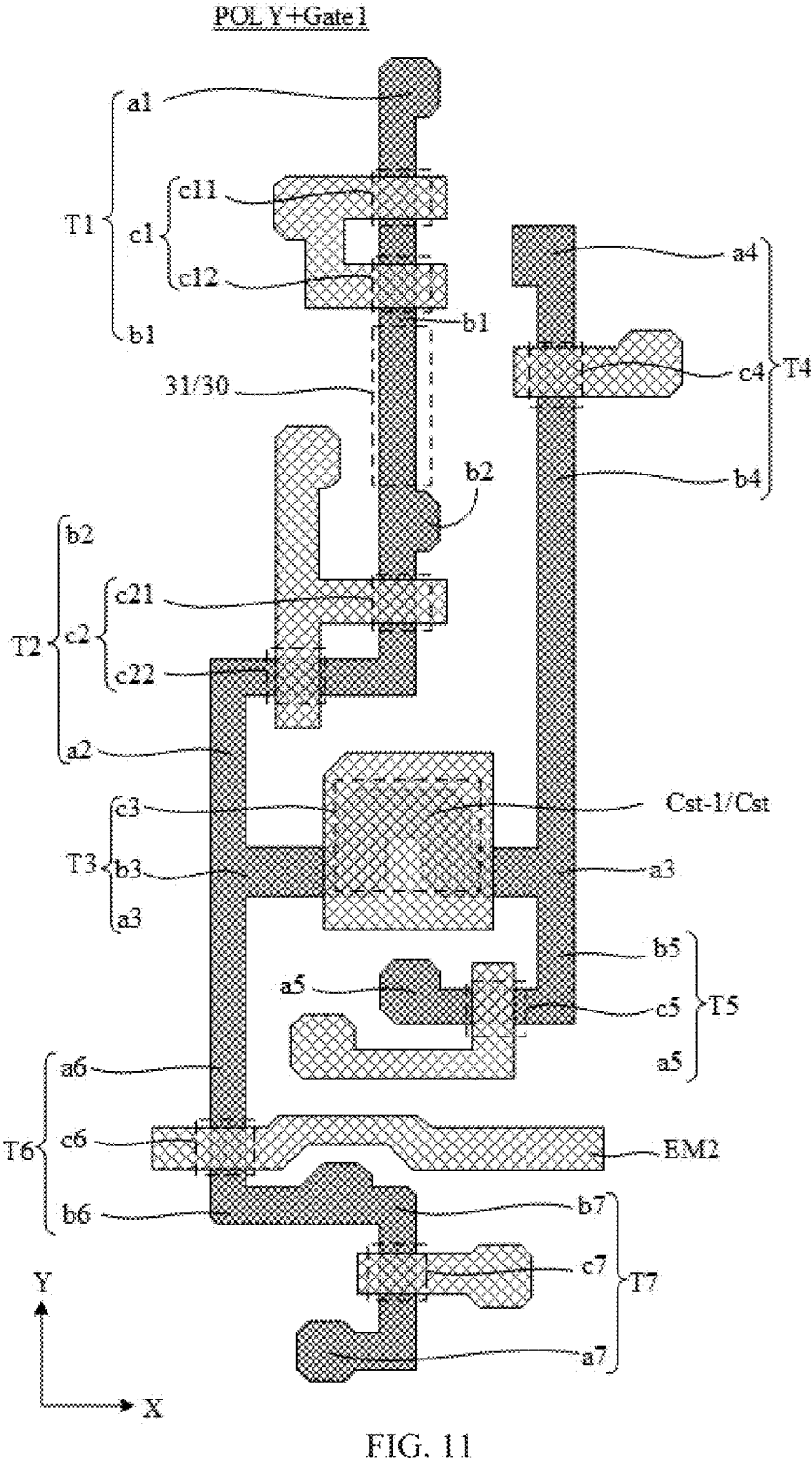
FIG. 11 is a diagram showing film layers of a semiconductor layer and a first gate metal layer in FIG. 9.
Figure 12:
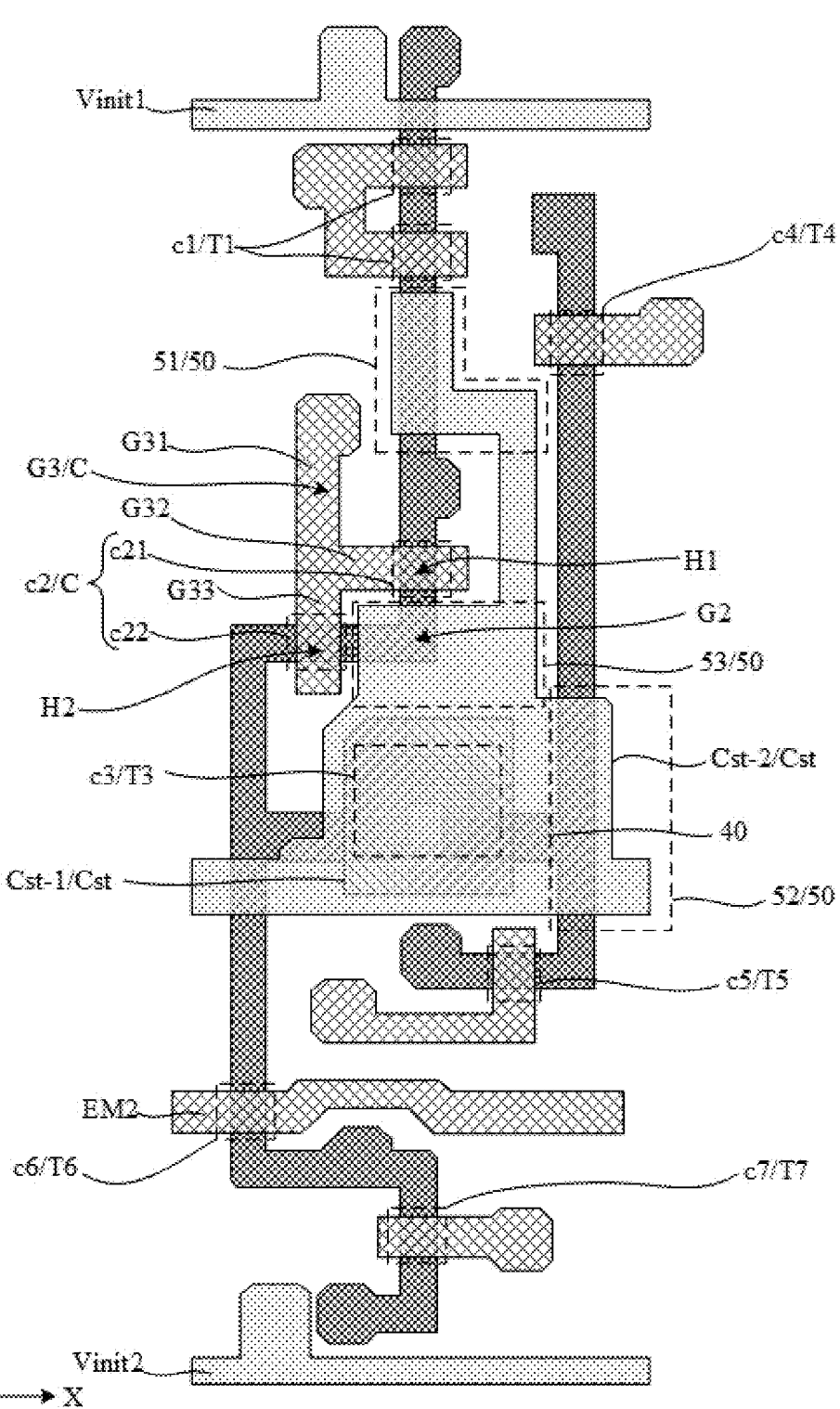
FIG. 12 is a diagram showing film layers of a semiconductor layer, a first gate metal layer, and a second gate metal layer in FIG. 9.
Figure 13:
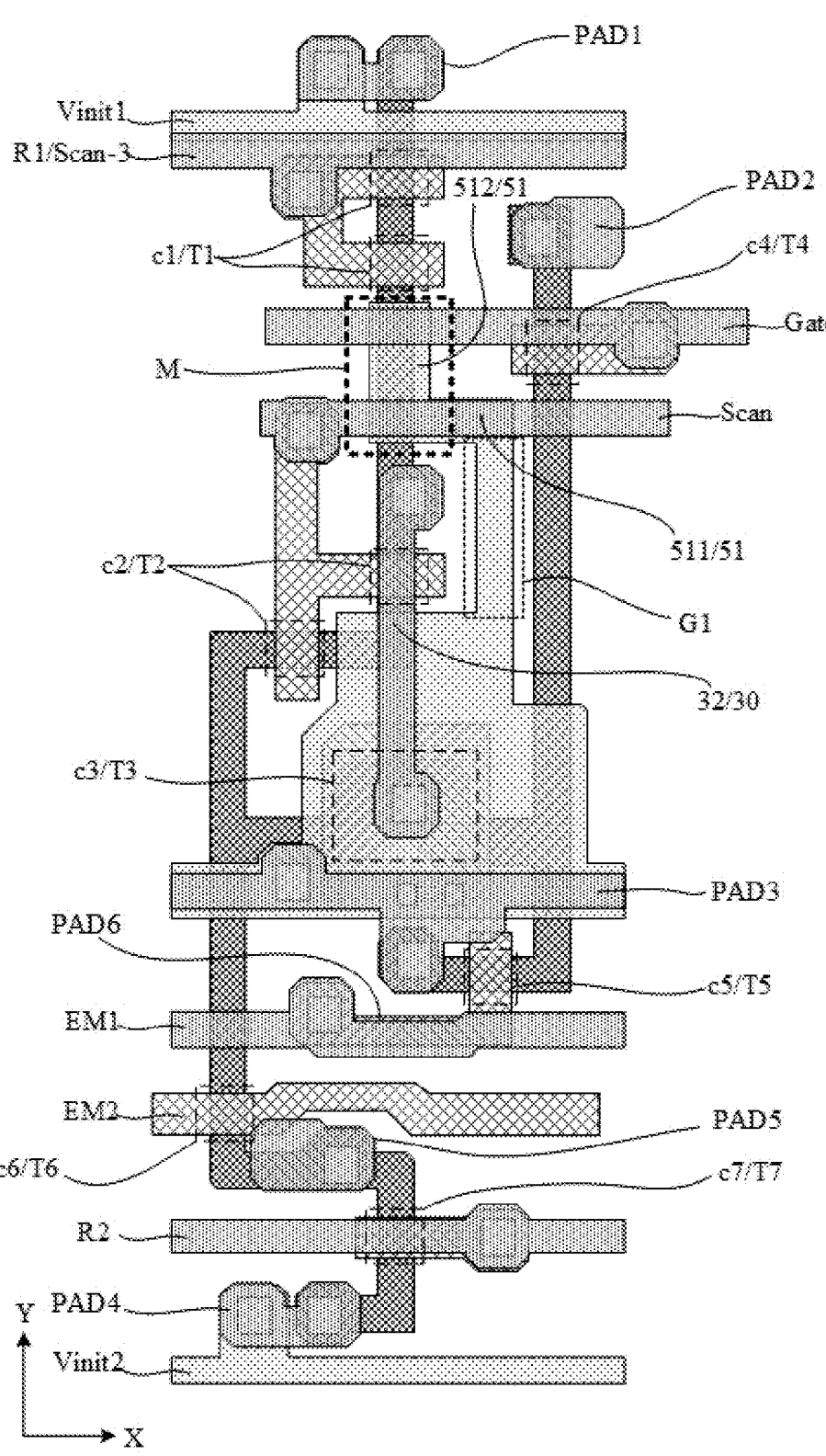
FIG. 13 is a diagram showing film layers of a semiconductor layer, a first gate metal layer, a second gate metal layer, and a first wire metal layer in FIG. 9.

FIG. 11 is a diagram showing film layers of a semiconductor layer and a first gate metal layer in FIG. 9; FIG. 12 is a diagram showing film layers of the semiconductor layer, the first gate metal layer, and a second gate metal layer in FIG. 9; and FIG. 13 is a diagram showing film layers of the semiconductor layer, the first gate metal layer, the second gate metal layer, and a first wire metal layer in FIG. 9.

In some embodiments, as shown in FIGS. 9 and 11 to 13, the driving circuit layer 20 (shown in FIG. 4) includes a semiconductor layer POLY, a first gate metal layer Gate1, a second gate metal layer Gate2, a first wire metal layer SD1 and a second wire metal layer SD2 that are stacked on the substrate 10.

As shown in FIGS. 9 and 11, the semiconductor layer POLY is located on the substrate 10, and the semiconductor layer POLY can include the first electrodes and the second electrodes of the seven transistors in the above "7T1C" pixel driving circuit.

For example, the semiconductor layer POLY includes the first electrode a1 and the second electrode b1 of the first reset transistor T1, the first electrode a2 and the second electrode b2 of the compensation transistor T2, the first electrode a3 and the second electrode b3 of the driving transistor T3, the first electrode a4 and the second electrode b4 of the data writing transistor T4, and so on. In the case of the "8T1C" pixel driving circuit Q, the semiconductor layer POLY can further include the first electrode and the second electrode of the third reset transistor.

As shown in FIGS. 9 and 11, the first gate metal layer Gate1 is located on a side of the semiconductor layer POLY away from the substrate 10. The first gate metal layer Gate1 may include the control electrodes of the seven transistors in the above "7T1C" pixel driving circuit.

For example, the first gate metal layer Gate1 includes the control electrode c1 of the first reset transistor T1, the control electrode c2 of the compensation transistor T2, the control electrode c3 of the driving transistor T3, and the control electrode c4 of the data writing transistor T4. In the case of the "8T1C" pixel driving circuit Q, the first gate metal layer Gate1 may further include the control electrode of the third reset transistor.

For example, a material of the first gate metal layer Gate1 includes a conductive metal. The conductive metal may include at least one of aluminum, copper, or molybdenum, and the present disclosure is not limited thereto.

For example, a first gate insulating layer is disposed between the semiconductor layer POLY and the first gate metal layer Gate1, and the first gate insulating layer enables the semiconductor layer POLY to be electrically insulated from the first gate metal layer Gate1.

For example, a material of the first gate insulating layer includes any one of inorganic insulating materials of silicon nitride, silicon oxynitride and silicon oxide. The material of the first gate insulating layer can include silicon dioxide, and the present disclosure is not limited thereto.

It should be noted that, as shown in FIG. 9, an ortho-graphic projection of the semiconductor layer POLY on the substrate 10 overlaps with an orthographic projection of the first gate metal layer Gate1 on the substrate 10. Portions of the semiconductor layer POLY covered by the first gate metal layer Gate1 form channel portions of the transistors, and portions of the semiconductor layer POLY not covered by the first gate metal layer Gate1 are conductive portions, which form the first electrodes or the second electrodes of the transistors.

Here, the first gate metal layer Gate1 further includes a plurality of second enable signal lines EM2. The plurality of second enable signal lines EM2 extend in the row direction X and are arranged in the column direction Y.

For example, the second enable signal line EM2 includes a first portion, an orthographic projection of the first portion of the second enable signal line EM2 on the substrate 10 overlaps with the semiconductor layer POLY, and the first portion of the second enable signal line EM2 is also used as the control electrode c6 of the second light-emitting control transistor T6.

Based on this, the control electrode c6 of the second light-emitting control transistor T6 does not need to be manufactured separately, and there is no need to provide a conductive portion to electrically connect the control elec-trode c6 of the second light-emitting control transistor T6 and the second enable signal line EM2, which may simplify the process of the array substrate 100.

As shown in FIGS. 9 and 12, the second gate metal layer Gate2 is located on a side of the first gate metal layer Gate1 away from the semiconductor layer POLY. The second gate metal layer Gate2 can include a plurality of first initializa-tion signal lines Vinit1 and a plurality of second initializa-tion signal lines Vinit2. The plurality of first initialization signal lines Vinit1 extend in the row direction X and are arranged in the column direction Y, and the plurality of second initialization signal lines Vinit2 also extend in the row direction X and are arranged in the column direction Y.

The second gate metal layer Gate2 may further include a plurality of first enable signal lines EM1, and the plurality of first enable signal lines EM1 extend in the row direction X and are arranged in the column direction Y.

In addition, the first electrode plate Cst-1 of the storage capacitor Cst can be located in the first gate metal layer Gate1, and the second electrode plate Cst-2 of the storage capacitor Cst can be located in the second gate metal layer Gate2. An orthographic projection of the second electrode plate Cst-2 of the storage capacitor Cst on the substrate 10 at least partially overlaps with an orthographic projection of the first electrode plate Cst-1 of the storage capacitor Cst on the substrate 10 to form the storage capacitor Cst.

For example, the first electrode plate Cst-1 of the storage capacitor Cst located in the first gate metal layer Gate1 is also used as the control electrode c3 of the driving transistor T3. Based on this, there is no need to separately provide the control electrode c3 of the driving transistor T3, which may help simplify the manufacturing process of the pixel driving circuit Q. Furthermore, it may also be possible to achieve the direct electrical connection between the first electrode plate Cst-1 of the storage capacitor Cst and the control electrode c1 of the driving transistor T3 without providing a separate connection portion, which may be beneficial to the layout of the pixel driving circuit Q.

For example, the material of the second gate metal layer Gate2 is the same as that of the first gate metal layer Gate1. It can be understood that, in some other examples, the material of the second gate metal layer Gate2 can be different from that of the first gate metal layer Gate1. The embodiments of the present disclosure are not limited to this. For example, a second gate insulating layer is disposed between the second gate metal layer Gate2 and the first gate metal layer Gate1. The second gate insulating layer enables the second gate metal layer Gate2 to be electrically insulated from the first gate metal layer Gate1.

For example, a material of the second gate insulating layer includes any one of inorganic insulating materials of silicon nitride, silicon oxynitride and silicon oxide. The material of the second gate insulating layer can include silicon dioxide, and the present disclosure is not limited thereto.

As shown in FIGS. 9 and 13, the first wire metal layer SD1 is located on a side of the second gate metal layer Gate2 away from the first gate metal layer Gate1. The first wire metal layer SD1 includes a plurality of first scan signal lines Gate and a plurality of second scan signal lines Scan.

The plurality of first scan signal lines Gate extend in the row direction X and are arranged in the column direction Y. A single first scan signal line Gate is electrically connected to control electrodes c4 of data writing transistors T4 in a row of pixel driving circuits Q.

The plurality of second scan signal lines Scan extend in the row direction X and are arranged in the column direction Y. A single second scan signal line Scan is electrically connected to control electrodes c3 of compensation transis-tors T2 in a row of pixel driving circuits Q. In the column direction Y, the second scan signal line Scan is located between the first scan signal line Gate and the driving transistor T3.

The first wire metal layer SD1 further includes a plurality of first enable signal lines EM1, a plurality of first reset signal lines R1, and a plurality of second reset signal lines R2. The plurality of first enable signal lines EM1, the plurality of first reset signal lines R1, and the plurality of second reset signal lines R2 all extend in the row direction X and are arranged in the column direction Y.

The row direction X and the column direction Y intersect, and are both parallel to the substrate 10.

In some examples, the row direction X and the column direction Y are approximately perpendicular. In this case, an included angle between the row direction X and the column direction Y is approximately equal to 90°. For example, the included angle between the row direction X and the column direction Y is 85°, 90° or 95°.

For example, the first wire metal layer SD1 is made of a titanium (Ti)-aluminum (Al)-titanium (Ti) multi-layer com-posite material.

For example, a first planarization layer (PLN) is disposed between the first wire metal layer SD1 and the second gate metal layer Gate2. The first planarization layer can enable the first wire metal layer SD1 to be electrically insulated from the second gate metal layer Gate2.

For example, a material of the first planarization layer is generally an organic material. For example, the material of the first planarization layer includes at least one of polyim-ide (PI), an acrylic-based polymer, or a silicon-based poly-mer.

In addition, the first wire metal layer SD1 can include a plurality of conductive portions, and the conductive portions are used to connect the transistors in the pixel driving circuit Q and the signal lines.

In some examples, as shown in FIG. 13, the plurality of conductive portions include a first transfer portion PAD1, and the first transfer portion PAD1 is used to electrically connect the first electrode a1 of the first reset transistor T1 and the first initialization signal line Vinit1.

The plurality of conductive portions further include a second transfer portion PAD2, and the second transfer portion PAD2 is used to electrically connect the first electrode a4 of the data writing transistor T4 and the data signal line Data.

The plurality of conductive portions further include a third transfer portion PAD3, and the third transfer portion PAD3 is used to electrically connect the second electrode plate Cst-2 of the storage capacitor Cst and the first electrode a5 of the first light-emitting control transistor T5.

The plurality of conductive portions further include a fourth transfer portion PAD4, and the fourth transfer portion PAD4 is used to electrically connect the first electrode a7 of the second reset transistor T7 and the second initialization signal line Vinit2.

The plurality of conductive portions further include an anode transfer portion PAD5, an end of the anode transfer portion PAD5 is connected to the second electrode b6 of the second light-emitting control transistor T6 and the second electrode b7 of the second reset transistor T7, and another end of the anode transfer portion PAD5 is electrically connected to the anode of the light-emitting device in the light-emitting device layer. Thus, the electrical connection between the pixel driving circuit Q and the light-emitting device O is achieved.

The first gate metal layer Gate1 further includes a sixth transfer portion PAD6, an end of the sixth transfer portion PAD6 includes a first portion, an orthographic projection of the first portion of the sixth transfer portion PAD6 on the substrate 10 overlaps with that of the semiconductor layer POLY on the substrate 10, and the first portion of the sixth transfer portion PAD6 is also used as the control electrode c5 of the first light-emitting control transistor T5.

Moreover, an orthographic projection of another end of the sixth transfer portion PAD6 on the substrate 10 overlaps with an orthographic projection of the first enable signal line EM1 on the substrate 10, so that the another end of the sixth transfer portion PAD6 is electrically connected to the first enable signal line EM1. For example, the another end of the sixth transfer portion PAD6 is electrically connected to the first enable signal line EM1 through a via hole.

With such arrangement, the electrical connection between the control electrode c5 of the first light-emitting control transistor T5 and the first enable signal line EM1 may be achieved.

As shown in FIG. 9, the second wire metal layer SD2 is located on a side of the first wire metal layer SD1 away from the first gate metal layer Gate1.

In some examples, a material of the second wire metal layer SD2 is the same as that of the first wire metal layer SD1. It can be understood that, the material of the second wire metal layer SD2 can be different from that of the first wire metal layer SD1. The embodiments of the present disclosure are not limited to this.

For example, a second planarization layer is disposed between the second wire metal layer SD2 and the first wire metal layer SD1. The second planarization layer enables the second wire metal layer SD2 to be electrically insulated from the first wire metal layer SD1.

For example, a material of the second planarization layer is generally an organic material. For example, the material of the second planarization layer includes at least one of polyimide (PI), an acrylic-based polymer, or a silicon-based polymer.

In addition, the second wire metal layer SD2 can include a plurality of first power supply signal lines VDD and a plurality of data signal lines Data.

The plurality of first power supply signal lines VDD are arranged in the row direction X and extend in the column direction Y. The first power supply signal line VDD is configured to provide a first power supply signal for the pixel driving circuit Q, and the first power supply signal is a constant voltage signal. The first power supply signal line VDD can be electrically connected to the third transfer portion PAD3 through via hole(s), so that the first power supply signal line VDD is electrically connected to the second electrode plate Cst-2 of the storage capacitor Cst and the first electrode a5 of the first light-emitting control transistor T5 by using the third transfer portion PAD3.

In some examples, an orthographic projection of the first power supply signal line VDD on the substrate 10 overlaps with orthographic projections of the driving transistor T3 and the first light-emitting control transistor T5 on the substrate 10. Based on this, it facilitates the electrical connection between the first power supply signal line VDD and both the second electrode plate Cst-2 of the storage capacitor Cst and the first electrode a5 of the first light-emitting control transistor T5.

The plurality of data signal lines Data are arranged in the row direction X and extend in the column direction Y. The data signal line Data is configured to provide a data writing signal to the pixel driving circuit Q. The data signal line Data can be electrically connected to the second transfer portion PAD2 through via hole(s), so that the data signal line Data is electrically connected to the first electrode a4 of the data writing transistor T4 through the second transfer portion PAD2.

In some examples, in the row direction X, the data signal line Data is located on a side of the first power supply signal line VDD away from the driving transistor T3. Thus, the data signal line Data may be made closer to the data writing transistor T4 relative to the first power supply signal line VDD, thereby preventing the data signal line Data from being short-circuited with other conductive portions when the data signal line Data is electrically connected to the data writing transistor T4 through the via hole.

In some embodiments, as shown in FIG. 9, based on the layout of the film layers of the pixel driving circuit Q in the array substrate 100, the first scan signal line Gate and the second scan signal line Scan are located in the first wire metal layer SD1; and the first conductive portion 31 of the first conductive connection portion 30 can be located in the semiconductor layer POLY, an end of the first conductive portion 31 is electrically connected to the second electrode b1 of the first reset transistor T1, and another end of the first conductive portion 31 is electrically connected to the second electrode b2 of the compensation transistor T2. For example, the another end of the first conductive portion 31 is also used as the second electrode b2 of the compensation transistor T2.

Moreover, the first conductive connection portion 30 further includes a second conductive portion 32, and the second conductive portion 32 is located in the first wire metal layer SD1. The another end of the first conductive portion 31 can further be electrically connected to the control electrode c3 of the driving transistor T3 through the second conductive portion 32. Based on this, the first conductive portion 31 and the second conductive portion 32 in the first conductive connection portion 30 are used to achieve the electrical connections between the second electrode b1 of the first reset transistor T1, the second electrode b2 of the compensation transistor T2, and the control electrode c3 of the driving transistor T3.

Since the shielding layer 50 is located in the film layer between the film layer where the two scan signal lines (the first scan signal line Gate and the second scan signal line Scan) are located and the film layer where the first conductive portion 31 of the first conductive connection portion 30 is located, the first shielding pattern 51 of the shielding layer 50 is used to isolate the two scan signal lines from the first conductive portion 31 of the first conductive connection portion 30, thereby improving the voltage stability of the first conductive connection portion 30.

Based on this, the shielding layer 50 is located in the film layer between the first wire metal layer SD1 and the semiconductor layer POLY. For example, the shielding layer 50 is located in the second gate metal layer Gate2. Alternatively, in a case where the array substrate 100 includes another metal layer between the second gate metal layer Gate2 and the first wire metal layer SD1, the shielding layer 50 may be located in the second gate metal layer Gate2 or another metal layer. The embodiments of the present disclosure are not limited this.

In some embodiments, as shown in FIGS. 9 and 12, the second electrode plate Cst-2 of the storage capacitor Cst in the pixel driving circuit Q is electrically connected to the first power supply signal line VDD, the first power supply signal line VDD is configured to provide a first power supply signal, and the first power supply signal is a constant voltage signal.

Based on this, the first shielding layer 50 can be electrically connected to the second electrode plate Cst-2 of the storage capacitor Cst, so that the first shielding layer 50 can receive the constant voltage signal (first power supply signal) provided by the first power supply signal line VDD. Thus, the first shielding layer 50 has a constant voltage signal.

With such arrangement, there is no need to provide a separate constant voltage signal line for transmitting the constant voltage signal to the first shielding layer 50, which may reduce the number of signal lines of the array substrate 100, thereby facilitating the layout of the array substrate 100.

In some embodiments, as shown in FIGS. 9 and 12, in the case where the first shielding layer 50 is electrically connected to the second electrode plate Cst-2 of the storage capacitor Cst, since the second electrode plate Cst-2 of the storage capacitor Cst is located in the second gate metal layer Gate2, the first shielding layer 50 can be arranged to be in the same layer as the second electrode plate Cst-2 of the storage capacitor Cst.

With such arrangement, it may satisfy that the first shielding layer 50 is located between the first wire metal layer SD1 and the semiconductor layer POLY to isolate the two scan signal lines from the first conductive portion 31 of the first conductive connection portion 30. Furthermore, the first shielding layer 50 and the second electrode plate Cst-2 of the storage capacitor Cst may be formed by using the same mask through a single patterning process, which is beneficial to simplifying the process of the array substrate 100.

It should be noted that, the "same layer" refers to a layer structure formed by forming a film layer for forming specific patterns through a same film forming process and then performing a single patterning process using the same mask. Depending on different specific patterns, the single patterning process may include exposure processes, development processes or etching processes, the specific patterns in the formed layer structure may be continuous or discontinuous, and these specific patterns may also be at different heights or have different thicknesses.

The following will be described by taking an example where the first shielding layer 50 and the second electrode plate Cst-2 of the storage capacitor Cst are in the same layer.

In some embodiments, as shown in FIG. 13, the second gate metal layer Gate2 further includes a first auxiliary connection portion G1, an end of the first auxiliary connection portion G1 is electrically connected to the second electrode plate Cst-2 of the storage capacitor Cst, and another end of the first auxiliary connection portion G1 is electrically connected to the first shielding pattern 51, thereby achieving the electrical connection between the second electrode plate Cst-2 of the storage capacitor Cst and the first shielding pattern 51.

In the row direction X, the first auxiliary connection portion G1 is located between the compensation transistor T2 and the second conductive connection portion 40. Since the control electrode c2 of the compensation transistor T2 is located in the first gate metal layer Gate1, the first auxiliary connection portion G1 is formed in the second gate metal layer Gate2 that is on the side of the first gate metal layer Gate1 away from the substrate 10, it is equivalent to forming the first auxiliary connection portion G1 on the side of the control electrode c2 of the compensation transistor T2 away from the substrate 10.

Since the control electrode c2 of the compensation transistor T2 has a certain thickness, a step is formed in the surface of the second gate insulating layer (i.e., the insulating layer between the first gate metal layer Gate1 and the second gate metal layer Gate2) away from the substrate 10. This step may cause cracks to easily appear in the first auxiliary connection portion G1 formed on the side of the second gate insulating layer away from the substrate 10, affecting the quality of the first auxiliary connection portion G1 and further affecting the voltage stabilization effect of the first shielding pattern 51.

Based on this, an orthographic projection of the first auxiliary connection portion G1 on the substrate 10 is arranged to have no overlap with an orthographic projection of the control electrode c2 of the compensation transistor T2 on the substrate 10, so as to prevent cracks in the first auxiliary connection portion G1.

In addition, since the second electrode b2 of the compensation transistor T2 located in the semiconductor layer POLY needs to be electrically connected to the second conductive portion 32 of the first conductive connection portion 30 located in the first wire metal layer SD1 through via hole(s), if the orthographic projection of the first auxiliary connection portion G1 on the substrate 10 overlaps with the orthographic projection of the second electrode b2 of the compensation transistor T2 on the substrate 10, the first auxiliary connection portion G1 is easily formed in the above via hole, resulting in a short circuit with the second electrode b2 of the compensation transistor T2.

Based on this, the orthographic projection of the first auxiliary connection portion G1 on the substrate 10 is arranged to have no overlap with the orthographic projection of the second electrode b2 of the compensation transistor T2 on the substrate 10, so as to prevent the first auxiliary connection portion G1 and the second electrode b2 of the compensation transistor T2 from being short-circuited.

The above embodiments, combined with the relevant drawings, mainly introduce the film layer position of the first shielding layer 50 in the array substrate 100 and the corresponding position definition. The specific structure of the first shielding pattern 51 of the first shielding layer 50 and its position definition will be described below in combination with relevant drawings, so as to achieve the voltage stabilization effect of the first node N1 by using the first shielding pattern 51.

Figure 14:
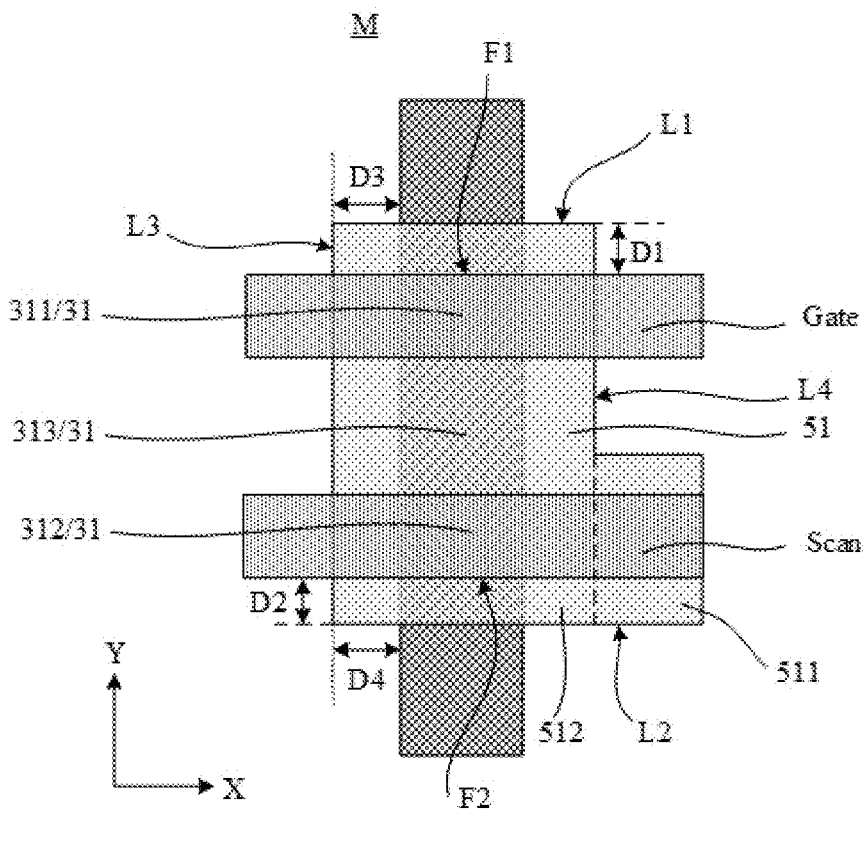
FIG. 14 is a partial enlarged view of the region M in FIG. 13.

FIG. 14 is a partial enlarged view of the region M in FIG. 13.

In some embodiments, as shown in FIGS. 9, 13 and 14, the first conductive portion 31 includes a first conductive sub-portion 311 and a second conductive sub-portion 312 that are connected. The orthographic projection of the first conductive sub-portion 311 on the substrate 10 overlaps with the orthographic projection of the first scan signal line Gate on the substrate 10, and the orthographic projection of the second conductive sub-portion 312 on the substrate 10 overlaps with the orthographic projection of the second scan signal line Scan on the substrate 10. Based on the above structure, for the position of the first shielding pattern 51, there are the following three situations.

In the first situation, in the case where the orthographic projection of the first conductive sub-portion 311 on the substrate 10 overlaps with the orthographic projection of the first scan signal line Gate on the substrate 10, the orthographic projection of the first conductive sub-portion 311 on the substrate 10 can be within the borders of the orthographic projection of the first shielding pattern 51 on the substrate 10.

Based on this, the first shielding pattern 51 may be used to completely cover the first conductive sub-portion 311, so as to better isolate the first conductive sub-portion 311 from the first scan signal line Gate, thereby reducing the parasitic capacitance between the first conductive sub-portion 311 and the first scan signal line Gate, reducing the influence of the voltage jump of the first scan signal transmitted by the first scan signal line Gate on the first conductive sub-portion 311, reducing the influence of the first scan signal line Gate on the first conductive connection portion 30 (first node N1), and improving the stability of the driving transistor T3.

For example, a portion of the first conductive portion 31, whose orthographic projection on the substrate 10 overlaps with the orthographic projection of the first scan signal line Gate on the substrate 10 is the first conductive sub-portion 311. Based on this, the orthographic projection of the first conductive sub-portion 311 on the substrate 10 is within the borders of the orthographic projection of the first shielding pattern 51 on the substrate 10, which is equivalent to using the first shielding pattern 51 to completely cover the overlapping portion of the orthographic projections of the first conductive portion 31 and the first scan signal line Gate on the substrate 10.

Based on this, the influence of the voltage jump of the first scan signal transmitted by the first scan signal line Gate on the first conductive connection portion 30 may be further reduced, so as to improve the stability of the driving transistor T3.

In the second situation, in the case where the orthographic projection of the second conductive sub-portion 312 on the substrate 10 overlaps with the orthographic projection of the second scan signal line Scan on the substrate 10, the orthographic projection of the second conductive sub-portion 312 on the substrate 10 can be within the borders of the orthographic projection of the first shielding pattern 51 on the substrate 10.

Based on this, the first shielding pattern 51 may be used to completely cover the second conductive sub-portion 312, so as to better isolate the second conductive sub-portion 312 from the second scan signal line Scan, thereby reducing the parasitic capacitance between the second conductive sub-portion 312 and the second scan signal line Scan, reducing the influence of the voltage jump of the second scan signal transmitted by the second scan signal line Scan on the second conductive sub-portion 312, reducing the influence of the second scan signal line Scan on the first conductive connection portion 30 (first node N1), and improving the stability of the driving transistor T3.

For example, a portion of the first conductive portion 31, whose orthographic projection on the substrate 10 overlaps with the orthographic projection of the second scan signal line Scan on the substrate 10 is the second conductive sub-portion 312. Based on this, the orthographic projection of the second conductive sub-portion 312 on the substrate 10 is within the borders of the orthographic projection of the first shielding pattern 51 on the substrate 10, which is equivalent to using the first shielding pattern 51 to completely cover the overlapping portion of the orthographic projections of the first conductive portion 31 and the second scan signal line Scan on the substrate 10.

Based on this, the influence of the voltage jump of the second scan signal transmitted by the second scan signal line Scan on the first conductive connection portion 30 may be further reduced, so as to improve the stability of the driving transistor T3.

In the third situation, in the case where the orthographic projection of the first conductive sub-portion 311 on the substrate 10 overlaps with the orthographic projection of the first scan signal line Gate on the substrate 10, and the orthographic projection of the second conductive sub-portion 312 on the substrate 10 overlaps with the orthographic projection of the second scan signal line Scan on the substrate 10, the orthographic projections of the first conductive sub-portion 311 and the second conductive sub-portion 312 on the substrate 10 are both within the borders of the orthographic projection of the first shielding pattern 51 on the substrate 10.

Based on this, the first shielding pattern 51 may be used to completely cover the first conductive sub-portion 311 and the second conductive sub-portion 312 in the first conductive portion 30, thereby reducing the influence of the voltage jump of the signals transmitted by the two scan signal lines (the first scan signal line Gate and the second scan signal line Scan) on the first conductive portion 31, reducing the influence of the two scan signal lines on the first conductive connection portion 30 (the first node N1), and improving the stability of the driving transistor T3.

In some embodiments, as shown in FIGS. 9, 13 and 14, the first conductive portion 31 further includes a third conductive sub-portion 313, and the orthographic projection of the third conductive sub-portion 313 on the substrate 10 is non-overlapping with the orthographic projections of the two scan signal lines (the first scan signal line Gate and the second scan signal line Scan) on the substrate 10; an end of the third conductive sub-portion 313 is electrically connected to the first conductive sub-portion 311, and another end of the third conductive sub-portion 313 is electrically connected to the second conductive sub-portion 312.

Although there is no overlap between the third conductive sub-portion 313 and the two scan signal lines in their orthographic projections on the substrate 10, the third conductive sub-portion 313 is used to electrically connect the first conductive sub-portion 311 and the second conductive sub-portion 312, which results in the third conductive sub-portion 313 being relatively close to the two scan signal lines. Since the third conductive sub-portion 313 can form parasitic capacitances with the two scan signal lines, the voltage of the third conductive sub-portion 313 may also be affected by the two scan signal lines. Moreover, the voltage of the third conductive sub-portion 313 may be directly affected by the voltages of the first conductive sub-portion 311 and the second conductive sub-portion 312.

Based on this, in the case where the orthographic projection of the first conductive sub-portion 311 on the substrate 10 overlaps with the orthographic projection of the first scan signal line Gate on the substrate 10, and the orthographic projection of the second conductive sub-portion 312 on the substrate 10 overlaps with the orthographic projection of the second scan signal line Scan on the substrate 10, the orthographic projection of the third conductive sub-portion 313 on the substrate 10 can be arranged to overlap with the orthographic projection of the first shielding pattern 51 on the substrate 10.

Thus, the first shielding pattern 51 is used to increase the capacitance at the third conductive sub-portion 313, thereby enhancing the stability of the voltage at the third conductive sub-portion 313. Therefore, the first shielding pattern 51 may be used to reduce the influence of the two scan signal lines on the first conductive connection portion 30 (the first node N1), thereby improving the stability of the driving transistor T3.

In some examples, as shown in FIGS. 9, 13 and 14, in the case where the orthographic projections of the first conductive sub-portion 311 and the second conductive sub-portion 312 on the substrate 10 are both within the borders of the orthographic projection of the first shielding pattern 51 on the substrate 10, the orthographic projection of the third conductive sub-portion 313 on the substrate 10 is arranged to be within the borders of the orthographic projection of the first shielding pattern 51 on the substrate 10.

Based on this, the first shielding pattern 51 may be used to further increase the capacitance at the third conductive sub-portion 313, thereby better enhancing the stability of the voltage at the third conductive sub-portion 313. Therefore, the first shielding pattern 51 is used to better reduce the influence of the two scan signal lines on the first conductive connection portion 30 (the first node N1), thereby improving the stability of the driving transistor T3.

In some embodiments, as shown in FIGS. 9, 13 and 14, in the column direction Y, the first shielding pattern 51 includes a first edge L1 and a second edge L2, and the first edge L1 is located on a side of the second edge L2 away from the driving transistor T3. In the case where the orthographic projections of the first conductive sub-portion 311 and the second conductive sub-portion 312 on the substrate 10 are both within the borders of the orthographic projection of the first shielding pattern 51 on the substrate 10, for the outward expansion of the first shielding pattern 51 relative to the first conductive sub-portion 311 and the second conductive sub-portion 312 in the first conductive portion 31, there are the following three situations.

In the first situation, a first minimum distance D1 between an orthographic projection of the first edge L1 on the substrate 10 and an orthographic projection of a side F1 of the first conductive sub-portion 311 away from the second conductive sub-portion 312 on the substrate 10 can be set to be greater than or equal to 1 μm.

This is equivalent to expanding the first edge L1 of the first shielding pattern 51 outward by more than 1 μm (including 1 μm) relative to the first conductive sub-portion 311, which may increase the size of the first shielding pattern 51 and enhance the voltage stabilization effect of the first shielding pattern 51. In addition, it may facilitate the first shielding pattern 51 to completely cover the first conductive sub-portion 311, thereby preventing the first shielding pattern 51 from being unable to completely cover the first conductive sub-portion 311 due to process errors and other reasons, and improving the isolation effect of the first shielding pattern 51.

In some examples, the first minimum distance D1 is greater than or equal to 2 μm, which may further enhance the voltage stabilization effect of the first shielding pattern 51 and further improve the isolation effect of the first shielding pattern 51.

For example, the first minimum distance D1 is approximately any one of 1 μm, 2 μm, 3 μm, 4 μm, or 5 μm.

For the example where the first minimum distance D1 is approximately 1 μm, due to certain uncontrollable errors (such as manufacturing process errors, equipment accuracy errors, measurement errors), in a case where the error floating range of the first minimum distance D1 is within 5%×1 μm, it can be considered that the size of the first minimum distance D1 is equal to 1 μm.

In some embodiments, as shown in FIGS. 9, 13 and 14, in the column direction Y, the first reset transistor T1 is located on a side of the first scan signal line Gate away from the second scan signal line Scan. That is, in the column direction Y, the first reset transistor T1 is adjacent to the first scan signal line Gate.

Based on this, when the first shielding pattern 51 is expanded outward, it is necessary to limit the orthographic projection of the first shielding pattern 51 on the substrate 10 to be non-overlapping with the orthographic projection of the first reset transistor T1 on the substrate 10. That is, in the column direction Y, there is a gap between the first edge L1 of the first shielding pattern 51 and the first reset transistor T1.

Thus, it prevents the parasitic capacitance from forming between the first reset transistor T1 and the first shielding pattern 51, prevents the control electrode of the first reset transistor T1 from affecting the voltage of the first shielding pattern 51 when the control electrode of the first reset transistor T1 receives the first reset signal, and prevents reducing the voltage stabilization effect of the first shielding pattern 51 on the first conductive connection portion 30. Moreover, it also prevents the influence of the first shielding pattern 51 on the control electrode of the first reset transistor T1, and prevents affecting the opening degree of the first reset transistor T1, thereby preventing affecting the reset effect for the first conductive connection portion 30 (the first node N1).

In the second situation, a second minimum distance D2 between an orthographic projection of the second edge L2 on the substrate 10 and an orthographic projection of a side F2 of the second conductive sub-portion 312 away from the first conductive sub-portion 311 on the substrate 10 can be set to be greater than or equal to 1 μm.

This is equivalent to expanding the second edge L2 of the first shielding pattern 51 outward by more than 1 μm (including 1 μm) relative to the second conductive sub-portion 312, which may increase the size of the first shielding pattern 51 and enhance the voltage stabilization effect of the first shielding pattern 51. In addition, it may facilitate the first shielding pattern 51 to completely cover the second conductive sub-portion 312, thereby preventing the first shielding pattern 51 from being unable to completely cover the second conductive sub-portion 312 due to process errors and other reasons, and improving the isolation effect of the first shielding pattern 51.

In some examples, the second minimum distance D2 is greater than or equal to 2 μm, which may further enhance the voltage stabilization effect of the first shielding pattern 51 and further improve the isolation effect of the first shielding pattern 51.

For example, the second minimum distance D2 is approximately any one of 1 μm, 2 μm, 3 μm, 4 μm, or 5 μm.

For the example where the second minimum distance D2 is approximately 1 μm, due to certain uncontrollable errors (such as manufacturing process errors, equipment accuracy errors, measurement errors), in a case where the error floating range of the second minimum distance D2 is within 5%×1 μm, it can be considered that the size of the second minimum distance D2 is equal to 1 μm.

In some embodiments, as shown in FIGS. 9, 13 and 14, in the column direction Y, the second scan signal line Scan is located between the first scan signal line Gate and the driving transistor T3.

The control electrode c3 of the driving transistor T3 is located in the first gate metal layer Gate1. In a case where the first shielding pattern 51 is formed in a film layer above the first gate metal layer Gate1 (for example, the first shielding pattern 51 is located in the second gate metal layer Gate2), it is equivalent to forming the first shielding pattern 51 on a side of the control electrode c3 of the driving transistor T3 away from the substrate 10.

Since the control electrode c3 of the driving transistor T3 has a certain thickness, a step is formed in the surface of the second gate insulating layer (i.e., the insulating layer between the first gate metal layer Gate1 and the second gate metal layer Gate2) away from the substrate 10. This step may cause cracks to easily appear in the first shielding pattern 51 formed on the side of the second gate insulating layer away from the substrate 10, thereby affecting the voltage stabilization effect of the first shielding pattern 51.

Based on this, when the first shielding pattern 51 is expanded outward, it is necessary to limit the orthographic projection of the first shielding pattern 51 on the substrate 10 to be non-overlapping with the orthographic projection of the driving transistor T3 on the substrate 10. That is, in the column direction Y, there is a gap between the second edge L2 of the first shielding pattern 51 and the driving transistor T3. Thus, the problem of cracks in the first shielding pattern 51 caused by the driving transistor T3 may be improved.

In some examples, in the column direction Y, the second electrode b2 of the compensation transistor T2 is located between the driving transistor T3 and the second scan signal line Scan. That is, in the column direction Y, the second scan signal line Scan is adjacent to the second electrode b2 of the compensation transistor T2. Since the second electrode b2 of the compensation transistor T2 needs to be electrically connected to the second conductive portion 32 located in the first wire metal layer SD1 through via hole(s), if the orthographic projection of the first shielding pattern 51 on the substrate 10 overlaps with the orthographic projection of the second electrode b2 of the compensation transistor T2 on the substrate 10, the first shielding pattern 51 is easily formed in the above via hole, resulting in a short circuit with the second electrode b2 of the compensation transistor T2.

Based on this, when the first shielding pattern 51 is expanded outward, it is necessary to limit the orthographic projection of the first shielding pattern 51 on the substrate 10 to be non-overlapping with the orthographic projection of the second electrode b2 of the compensation transistor T2. That is, in the column direction Y, there is a gap between the second edge L2 of the first shielding pattern 51 and the second electrode b2 of the compensation transistor T2. Thus, it may be possible to prevent the first shielding pattern 51 from being short-circuited with the second electrode b2 of the compensation transistor T2.

In the third situation, the first minimum distance D1 between the orthographic projection of the first edge L1 on the substrate 10 and the orthographic projection of the side F1 of the first conductive sub-portion 311 away from the second conductive sub-portion 312 on the substrate 10 can be set to be greater than or equal to 1 μm, and the second minimum distance D2 between the orthographic projection of the second edge L2 on the substrate 10 and the ortho-graphic projection of the side F2 of the second conductive sub-portion 312 away from the first conductive sub-portion 311 on the substrate 10 can be set to be greater than or equal to 1 μm.

With such arrangement, it is equivalent to expanding the first edge L1 and the second edge L2 of the first shielding pattern 51 relatively outward by more than 1 μm (including 1 μm) at the same time, which may increase the size of the first shielding pattern 51 and enhance the voltage stabiliza-tion effect of the first shielding pattern 51. In addition, it may facilitate the first shielding pattern 51 to completely cover the first conductive sub-portion 311 and the second conduc-tive sub-portion 312, thereby preventing the first shielding pattern 51 from being unable to completely cover the first conductive sub-portion 311 and the second conductive sub-portion 312 due to process errors and other reasons, and improving the isolation effect of the first shielding pattern 51.

In some embodiments, as shown in FIGS. 9, 13 and 14, in the case where the orthographic projections of the first conductive sub-portion 311 and the second conductive sub-portion 312 on the substrate 10 are both within the borders of the orthographic projection of the first shielding pattern 51 on the substrate 10, for the outward expansion of the first shielding pattern 51 relative to the first conductive sub-portion 311 and the second conductive sub-portion 312 in the first conductive portion 31, there are the following three situations.

In the first situation, in the row direction X, a third minimum distance D3 between an orthographic projection of an edge of the first shielding pattern 51 on the substrate 10 and a border of the orthographic projection of the first conductive sub-portion 311 on the substrate 10 is greater than or equal to 1 μm. In the row direction X, edges of the first shielding pattern 51 includes a third edge L3 and a fourth edge L4 that are arranged oppositely.

That is, the third minimum distance D3 between the orthographic projection of the third edge L3 of the first shielding pattern 51 on the substrate 10 and a border of the orthographic projection of the first conductive sub-portion 311 on the substrate 10 is greater than or equal to 1 μm, and the third minimum distance D3 between the orthographic projection of the fourth edge L4 of the first shielding pattern 51 on the substrate 10 and a border of the orthographic projection of the first conductive sub-portion 311 on the substrate 10 is greater than or equal to 1 μm.

With such arrangement, it is equivalent to expanding both the third edge L3 and the fourth edge L4 of the first shielding pattern 51 outward by more than 1 μm (including 1 μm), which may increase the size of the first shielding pattern 51 and enhance the voltage stabilization effect of the first shielding pattern 51. In addition, it may facilitate the first shielding pattern 51 to completely cover the first conductive sub-portion 311, thereby preventing the first shielding pat-tern 51 from being unable to completely cover the first conductive sub-portion 311 due to process errors and other reasons, and improving the isolation effect of the first shielding pattern 51.

In some examples, the third minimum distance D3 is greater than or equal to 2 μm, which may further enhance the voltage stabilization effect of the first shielding pattern 51 and further improve the isolation effect of the first shielding pattern 51.

For example, the third minimum distance D3 is approximately any one of 1 μm, 2 μm, 3 μm, 4 μm, or 5 μm.

For the example where the third minimum distance D3 is approximately 1 μm, due to certain uncontrollable errors (such as manufacturing process errors, equipment accuracy errors, measurement errors), in a case where the error floating range of the third minimum distance D3 is within 5%×1 μm, it can be considered that the size of the third minimum distance D3 is equal to 1 μm.

In the second situation, in the row direction X, a fourth minimum distance D4 between an orthographic projection of an edge of the first shielding pattern 51 on the substrate 10 and a border of the orthographic projection of the second conductive sub-portion 312 on the substrate 10 is greater than or equal to 1 μm. In the row direction X, edges of the first shielding pattern 51 includes a third edge L3 and a fourth edge L4 that are arranged oppositely.

That is, the fourth minimum distance D4 between the orthographic projection of the third edge L3 of the first shielding pattern 51 on the substrate 10 and a border of the orthographic projection of the second conductive sub-portion 312 on the substrate 10 is greater than or equal to 1 μm, and the fourth minimum distance D4 between the orthographic projection of the fourth edge L4 of the first shielding pattern 51 on the substrate 10 and a border of the orthographic projection of the second conductive sub-portion 312 on the substrate 10 is greater than or equal to 1 μm.

With such arrangement, it is equivalent to expanding both the third edge L3 and the fourth edge L4 of the first shielding pattern 51 outward by more than 1 μm (including 1 μm), which may increase the size of the first shielding pattern 51 and enhance the voltage stabilization effect of the first shielding pattern 51. In addition, it may facilitate the first shielding pattern 51 to completely cover the second conductive sub-portion 312, thereby preventing the first shielding pattern 51 from being unable to completely cover the second conductive sub-portion 312 due to process errors and other reasons, and improving the isolation effect of the first shielding pattern 51.

In some examples, the fourth minimum distance D4 is greater than or equal to 2 μm, which may further enhance the voltage stabilization effect of the first shielding pattern 51 and further improve the isolation effect of the first shielding pattern 51.

For example, the fourth minimum distance D4 is approximately any one of 1 μm, 2 μm, 3 μm, 4 μm, or 5 μm.

For the example where the fourth minimum distance D4 is approximately 1 μm, due to certain uncontrollable errors (such as manufacturing process errors, equipment accuracy errors, measurement errors), in a case where the error floating range of the fourth minimum distance D4 is within 5%×1 μm, it can be considered that the size of the fourth minimum distance D4 is equal to 1 μm.

In the third situation, in the row direction X, a third minimum distance D3 between an orthographic projection of an edge of the first shielding pattern 51 on the substrate 10 and a border of the orthographic projection of the first conductive sub-portion 311 on the substrate 10 is greater than or equal to 1 μm, and a fourth minimum distance D4 between the orthographic projection of the edge of the first shielding pattern 51 on the substrate 10 and a border of the orthographic projection of the second conductive sub-portion 312 on the substrate 10 is greater than or equal to 1 μm.

With such arrangement, it is equivalent to expanding both the third edge L3 and the fourth edge L4 of the first shielding pattern 51 outward by more than 1 μm (including 1 μm), which may increase the size of the first shielding pattern 51 and enhance the voltage stabilization effect of the first shielding pattern 51. In addition, it may facilitate the first shielding pattern 51 to completely cover the first conductive sub-portion 311 and the second conductive sub-portion 312, thereby preventing the first shielding pattern 51 from being unable to completely cover the first conductive sub-portion 311 and the second conductive sub-portion 312 due to process errors and other reasons, and improving the isolation effect of the first shielding pattern 51.

It should be noted that, in the case of expanding the third edge L3 and the fourth edge L4 of the first shielding pattern 51 outward, it is also necessary to prevent the third edge L3 and the fourth edge L4 of the first shielding pattern 51 from overlapping with other structures in the pixel driving circuit Q, so as to prevent affecting the service life and the voltage stabilization effect of the first shielding pattern 51.

The above embodiments mainly introduce the outward expansion of the first shielding pattern 51 relative to the first conductive portion 31 in combination with the relevant drawings. The structure of the first shielding pattern 51 will be introduced below in combination with the relevant drawings.

In some embodiments, as shown in FIGS. 9, 13 and 14, the first shielding pattern 51 includes a first shielding sub-portion 511 extending in the row direction X and a second shielding sub-portion 512 extending in the column direction Y. That is, the orthographic projection of the first shielding pattern 51 on the substrate 10 is in an L-shape.

An extension direction of the second shielding sub-portion 512 is substantially parallel to an extension direction of the first conductive portion 31. An orthographic projection of the second shielding sub-portion 512 on the substrate 10 overlaps with an orthographic projection of the first conductive connection portion 30 on the substrate 10, so that the second shielding sub-portion 512 of the first shielding pattern 51 is used to isolate the first conductive portion 31 of the first conductive connection portion 30 from the two scan signal lines (the first scan signal line Gate and the second scan signal line Scan), thereby improving the stability of the driving transistor T3.

An orthographic projection of the first shielding sub-portion 511 on the substrate 10 is non-overlapping with the orthographic projection of the first conductive portion 31 on the substrate 10, but overlaps with the orthographic projection of the second scan signal line Scan on the substrate 10.

Thus, the first shielding sub-portion 511 may be used to increase the size of the first shielding pattern 51 to improve the voltage stabilization effect of the first shielding pattern 51 on the first conductive connection portion 30 (the first node). Moreover, the first shielding sub-portion 511 may also be used to increase the overlapping area of orthographic projections of the first shielding pattern 51 and the second scan signal line Scan on the substrate 10, so as to further reduce the influence of the second scan signal line Scan on the first conductive connection portion 30 (the first node), thereby improving the voltage stabilization effect of the first shielding pattern 51 on the first conductive connection portion 30 (the first node).

In addition, the first shielding pattern 51 can be electrically connected to the first auxiliary connection portion G1 through the first shielding sub-portion 511. As shown in the above structure, the first shielding sub-portion 511 is equivalent to extending the first shielding pattern 51 along the row direction X, which may facilitate the electrical connection between the first shielding pattern 51 and the first auxiliary connection portion G1 to prevent the orthographic projection of the first auxiliary connection portion G1 on the substrate 10 from overlapping with the orthographic projection of each electrode of the compensation transistor T2 on the substrate 10, thereby avoiding causing related problems.

The above embodiments mainly introduce the structure of the first shielding pattern 51 of the first shielding layer 50 in combination with the relevant drawings. Other shielding patterns in the first shielding layer 50 will be described below in combination with relevant drawings. For example, the first shielding layer 50 further includes a second shielding pattern 52 and a third shielding pattern 53.

In some embodiments, as shown in FIGS. 9 and 12, the first shielding layer 50 further includes a second shielding pattern 52, and an orthographic projection of the second shielding pattern 52 on the substrate 10 overlaps with an orthographic projection of the second conductive connection portion 40 on the substrate 10.

The second shielding pattern 52 may be used to form a parasitic capacitance with the second conductive connection portion 40, and the voltage stability of the second conductive connection portion 40 may be enhanced by increasing the capacitance value of the second conductive connection portion 40.

Based on this, the situation where the voltage of the second conductive connection portion 40 is pulled by an alternating current signal transmitted by an adjacent signal line may be improved, thereby enhancing the stability of the second conductive connection portion 40 (the second node). This is equivalent to enhancing the stability of the driving transistor T3, which is beneficial to ensuring the brightness uniformity of the display panel 200.

In some embodiments, as shown in FIGS. 9 and 12, the orthographic projection of the second shielding pattern 52 on the substrate 10 overlaps with an orthographic projection of a portion of the second conductive connection portion 40 on the substrate 10.

Thus, the second shielding pattern 52 may be used to increase the capacitance value of the second conductive connection portion 40 and enhance the voltage stability of the second conductive connection portion 40. In addition, it may also be possible to prevent the capacitance value of the second conductive connection portion 40 from being too large, thereby avoiding causing the problem of increased power consumption.

The proportion of the portion of the second conductive connection portion 40 to the entire second conductive connection portion 40 can be adjusted according to specific situations, and the embodiments of the present disclosure are not limited thereto.

In some embodiments, as shown in FIGS. 9 and 12, the compensation transistor T2 is a dual-gate transistor, which may improve the leakage current of the compensation transistor T2 and reduce the influence on the first conductive connection portion 30 (the first node).

The control electrode c2 of the compensation transistor T2 includes a first control electrode c21 and a second control electrode c22. The first gate metal layer Gate1 includes a first conductive pattern C, and the first conductive pattern C includes the first control electrode c21 and the second control electrode c22 of the compensation transistor T2. The semiconductor layer POLY includes a first channel portion H1 and a second channel portion H2 of the compensation transistor T2. The semiconductor layer POLY further includes a second auxiliary connection portion G2; an end of the second auxiliary connection portion G2 is electrically connected to the first channel portion H1 of the compensation transistor T2, and another end of the second auxiliary connection portion G2 is electrically connected to the second channel portion H2 of the compensation transistor T2.

In some embodiments, as shown in FIGS. 9 and 12, the first shielding layer 50 further includes a third shielding pattern 53, and an orthographic projection of the third shielding pattern 53 on the substrate 10 overlaps with an orthographic projection of the second auxiliary connection portion G2 on the substrate 10. Based on this, the third shielding pattern 53 may be used to further improve the leakage current of the compensation transistor T2 and reduce the influence on the first conductive connection portion 30 (the first node).

In some embodiments, as shown in FIGS. 9 and 12, the orthographic projection of the third shielding pattern 53 on the substrate 10 is non-overlapping with orthographic projections of the first control electrode c21 and the second control electrode c22 of the compensation transistor T2 on the substrate 10. It may be possible to prevent cracks in the third shielding pattern 53 in a case where the third shielding pattern 53 is formed on a side of the first control electrode c21 and the second control electrode c22 of the compensation transistor T2 away from the substrate 10, and the quality of the third shielding pattern 53 may be improved.

In some embodiments, as shown in FIGS. 9 and 12, the first conductive pattern C further includes a third auxiliary connection portion G3, and the third auxiliary connection portion G3 is located on a side of the first control electrode c21 and the second control electrode c22 of the compensation transistor T2 away from the driving transistor T3. Based on the above structure, the third auxiliary connection portion G3 is used to electrically connect the control electrode c2 (the first control electrode c21 and the second control electrode c22) of the compensation transistor T2 to the second scan signal line Scan.

With such arrangement, the second scan signal line Scan may be moved to a side away from the driving transistor T3, so that the second scan signal line Scan is located between the second electrode b2 of the compensation transistor T2 and the first scan signal line Gate, thereby preventing the orthographic projection of the second scan signal line Scan on the substrate 10 from overlapping with the second electrode b2 of the compensation transistor T2, and preventing the second scan signal line Scan (located in the first wire metal layer SD1) from being short-circuited with the second conductive portion 32 (located in the first wire metal layer SD1) electrically connected to the second electrode b2 of the compensation transistor T2.

In some examples, the orthographic projection of the third auxiliary connection portion G3 on the substrate 10 may be in a "I" shape. Based on this, the third auxiliary connection portion G3 can be divided into a first sub-portion G31, a second sub-portion G32 and a third sub-portion G33. A first end of the first sub-portion G31, a first end of the second sub-portion G32 and a first end of the third sub-portion G33 are connected to the same point, so that the first sub-portion G31, the second sub-portion G32 and the third sub-portion G33 constitute the third auxiliary connection portion G3.

A second end of the first sub-portion G31 is electrically connected to the second scan signal line Scan, a second end of the second sub-portion G32 is electrically connected to the first control electrode c21 of the compensation transistor T2, and a second end of the third sub-portion G33 is electrically connected to the second control electrode c22 of the compensation transistor T2.

Based on this, the third auxiliary connection portion G3 may be used to electrically connect the control electrode c2 (the first control electrode c21 and the second control electrode c22) of the compensation transistor T2 to the second scan signal line Scan.

In some examples, the second sub-portion G32 extends in the row direction X; and in the row direction X, the second sub-portion G32 overlaps with the first control electrode c21 of the compensation transistor T2. Thus, it facilitates the electrical connection between the second sub-portion G32 and the first control electrode c21 of the compensation transistor T2.

For example, the structure formed by the second sub-portion G32 and the first control electrode c21 of the compensation transistor T2 has no other bending portions, which may reduce the size of the third auxiliary connection portion G3 and facilitate the layout of the array substrate 100.

In some examples, the third sub-portion G33 extends in the column direction Y; and in the column direction Y, the third sub-portion G33 overlaps with the second control electrode c22 of the compensation transistor T2. Thus, it facilitates the electrical connection between the third sub-portion G33 and the second control electrode c22 of the compensation transistor T2.

For example, the structure formed by the third sub-portion G33 and the second control electrode c22 of the compensation transistor T2 has no other bending portions, which may reduce the size of the third auxiliary connection portion G3 and facilitate the layout of the array substrate 100.

In some examples, the first sub-portion G31 and the third sub-portion G33 extend in the column direction Y, and an extension direction of a line connecting the first sub-portion G31 and the third sub-portion G33 is parallel to the column direction Y. That is, the structure formed by the first sub-portion G31 and the third sub-portion G33 has no other bending portions, which may reduce the size of the third auxiliary connection portion G3 and facilitate the layout of the array substrate 100.

Figure 15:
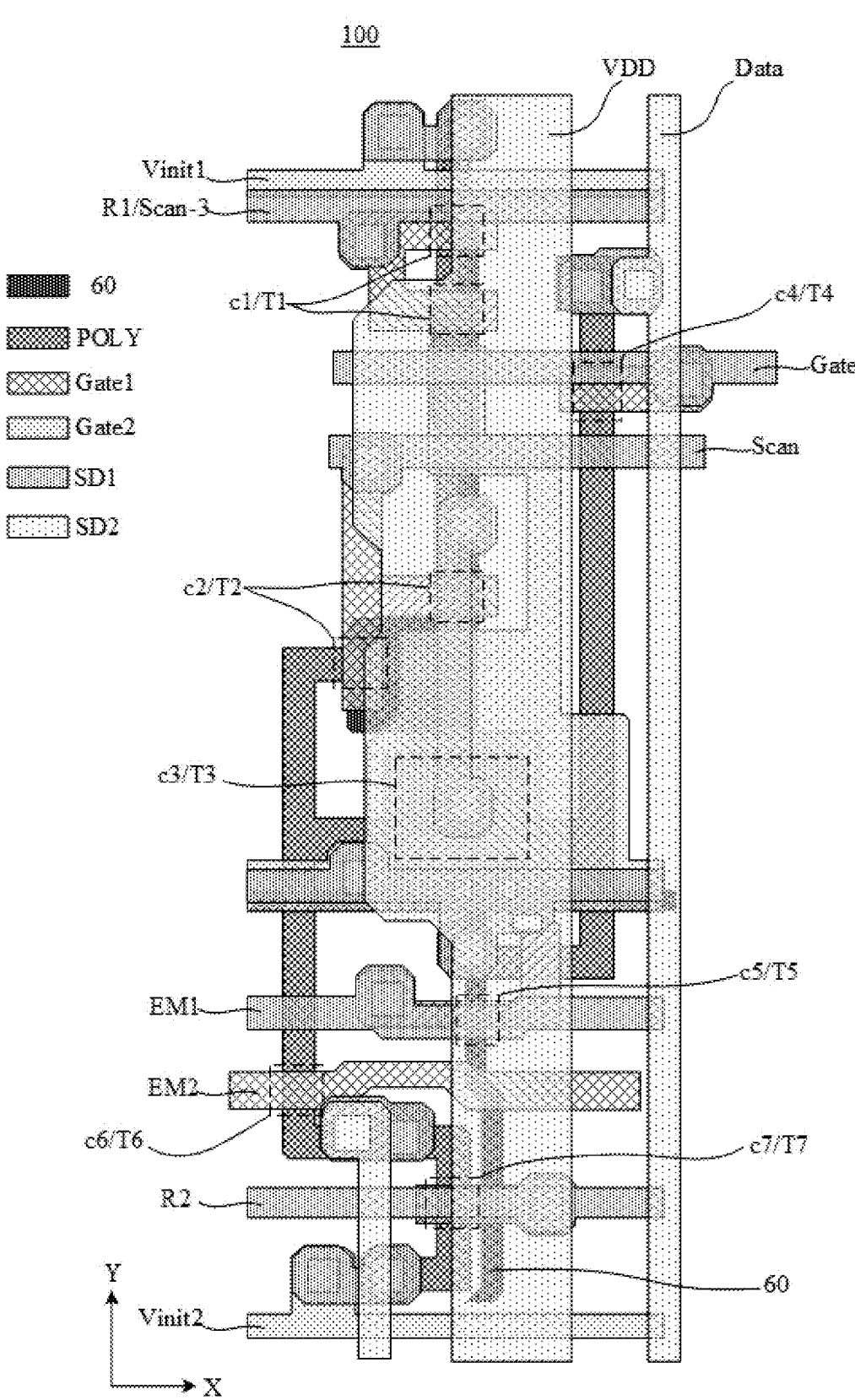
FIG. 15 is a diagram showing film layers of a pixel driving circuit and a bottom shielding layer, in accordance with some embodiments.

FIG. 15 is a diagram showing film layers of a pixel driving circuit and a bottom shielding layer, in accordance with some embodiments.

In some embodiments, as shown in FIG. 15, the array substrate 100 further includes a bottom shielding layer (bottom shield metal, BSM) 60 located between the substrate 10 and the pixel driving circuit Q, and an orthographic projection of the bottom shielding layer 60 on the substrate 10 covers an orthographic projection of the driving transistor T3 on the substrate 10.

Based on this, the bottom shielding layer 60 may be used to shield the influence of static electricity on the driving transistor T3. In addition, the bottom shielding layer 60 may also serve as a light-shielding layer to reduce the influence of external light incident from the side of the substrate 10 on the semiconductor layer POLY, thereby improving the performance of the semiconductor layer POLY.

In some examples, the orthographic projection of the driving transistor T3 on the substrate 10 is within the borders of the orthographic projection of the bottom shielding layer 60 on the substrate 10, which makes the bottom shielding layer 60 completely cover the driving transistor T3 to shield the influence of the static electricity on the driving transistor T3.

In some examples, the bottom shielding layer 60 is configured to receive a first power supply signal. Based on this, the static electricity accumulation on the bottom shielding layer 60 may be reduced.

In addition, two bottom shielding layers 60 corresponding to two adjacent pixel driving circuits Q may be electrically connected through a connection portion, thereby reducing the impedance of the bottom shielding layers 60.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure should be determined by the protection scope of the claims.

What is claimed is:

1. An array substrate, comprising a substrate and a driving circuit layer located on the substrate, wherein the driving circuit layer includes:
   a plurality of pixel driving circuits located on a side of the substrate and arranged in multiple rows and multiple columns, wherein
      a pixel driving circuit in the plurality of pixel driving circuits includes a first reset transistor, a compensation transistor, a driving transistor, a data writing transistor, a first conductive connection portion and a second conductive connection portion; and
      a control electrode of the driving transistor, a second electrode of the compensation transistor and a second electrode of the first reset transistor are all electrically connected to the first conductive connection portion, and a first electrode of the driving transistor and a second electrode of the data writing transistor are all electrically connected to the second conductive connection portion;
   a plurality of first scan signal lines located on the side of the substrate, wherein the plurality of first scan signal lines all extend in a row direction and are arranged in sequence in a column direction, and a first scan signal line is electrically connected to control electrodes of data writing transistors in a row of pixel driving circuits; and an orthographic projection of a first conductive portion of the first conductive connection portion on the substrate overlaps with an orthographic projection of the first scan signal line on the substrate;
   a plurality of second scan signal lines located on the side of the substrate, wherein the plurality of second scan signal lines all extend in the row direction and are arranged in sequence in the column direction, and a second scan signal line is electrically connected to control electrodes of compensation transistors in the row of pixel driving circuits; and the orthographic projection of the first conductive portion of the first conductive connection portion on the substrate overlaps with an orthographic projection of the second scan signal line on the substrate; and
   a first shielding layer configured to have a constant voltage signal, wherein the first shielding layer includes a first shielding pattern; in a thickness direction of the substrate, the first shielding pattern is located between the first scan signal line and the first conductive portion; and/or in the thickness direction of the substrate, the first shielding pattern is located between the second scan signal line and the first conductive portion.

2. The array substrate according to claim 1, wherein the driving circuit layer includes:

a semiconductor layer located on the substrate, wherein the semiconductor layer includes a first electrode and a second electrode of the first reset transistor, a first electrode and a second electrode of the compensation transistor, a first electrode and a second electrode of the driving transistor, and a first electrode and a second electrode of the data writing transistor;

a first gate metal layer located on a side of the semiconductor layer away from the substrate, wherein the first gate metal layer includes a control electrode of the first reset transistor, a control electrode of the compensation transistor, a control electrode of the driving transistor, and a control electrode of the data writing transistor;

a second gate metal layer located on a side of the first gate metal layer away from the semiconductor layer; and a first wire metal layer located on a side of the second gate metal layer away from the first gate metal layer, wherein the first wire metal layer includes the first scan signal line and the second scan signal line.

3. The array substrate according to claim 2, wherein the first conductive portion is located in the semiconductor layer; an end of the first conductive portion is electrically connected to the second electrode of the first reset transistor, and another end of the first conductive portion is electrically connected to the control electrode of the driving transistor and the second electrode of the compensation transistor;

the first conductive portion includes a first conductive sub-portion and a second conductive sub-portion that are connected; an orthographic projection of the first conductive sub-portion on the substrate overlaps with the orthographic projection of the first scan signal line on the substrate, and the orthographic projection of the first conductive sub-portion on the substrate is within borders of an orthographic projection of the first shielding pattern on the substrate; and/or an orthographic projection of the second conductive sub-portion on the substrate overlaps with the orthographic projection of the second scan signal line on the substrate, and the orthographic projection of the second conductive sub-portion on the substrate is within the borders of the orthographic projection of the first shielding pattern on the substrate.

4. The array substrate according to claim 3, wherein the first conductive portion further includes a third conductive sub-portion; an end of the third conductive sub-portion is electrically connected to the first conductive sub-portion, and another end of the third conductive sub-portion is electrically connected to the second conductive sub-portion; and an orthographic projection of the third conductive sub-portion on the substrate is within the borders of the orthographic projection of the first shielding pattern on the substrate.

5. The array substrate according to claim 3, wherein in the column direction, the first shielding pattern includes a first edge and a second edge, and the first edge is located on a side of the second edge away from the driving transistor;

a first minimum distance between an orthographic projection of the first edge on the substrate and an orthographic projection of a side of the first conductive sub-portion away from the second conductive sub-portion on the substrate is greater than or equal to 1 μm; and/or a second minimum distance between an orthographic projection of the second edge on the substrate and an orthographic projection of a side of the second conductive sub-portion away from the first conductive sub-portion on the substrate is greater than or equal to 1 μm.

6. The array substrate according to claim 3, wherein in the row direction, a third minimum distance between a border of the orthographic projection of the first shielding pattern on the substrate and a border of the orthographic projection of the first conductive sub-portion on the substrate is greater than or equal to 1 μm; and/or in the row direction, a fourth minimum distance between a border of the orthographic projection of the first shielding pattern on the substrate and a border of the orthographic projection of the second conductive sub-portion on the substrate is greater than or equal to 1 μm.

7. The array substrate according to claim 1, wherein the first shielding pattern includes a first shielding sub-portion extending in the row direction and a second shielding sub-portion extending in the column direction; and an orthographic projection of the first shielding sub-portion on the substrate overlaps with the orthographic projection of the second scan signal line on the substrate, and an orthographic projection of the second shielding sub-portion on the substrate overlaps with an orthographic projection of the first conductive portion of the first conductive connection portion on the substrate.

8. The array substrate according to claim 1, wherein in the column direction, the first reset transistor is located on a side of the first scan signal line away from the second scan signal line; and an orthographic projection of the first shielding pattern on the substrate is non-overlapping with an orthographic projection of the first reset transistor on the substrate.

9. The array substrate according to claim 1, wherein the pixel driving circuit further includes a storage capacitor, and the storage capacitor includes a first electrode plate and a second electrode plate; the first electrode plate of the storage capacitor is electrically connected to the first conductive connection portion, and the second electrode plate of the storage capacitor is electrically connected to a first power supply signal line; the first power supply signal line is configured to provide a first power supply signal, and the first power supply signal is a constant voltage signal;

the driving circuit layer includes a first gate metal layer and a second gate metal layer located on a side of the first gate metal layer away from the substrate; the first gate metal layer includes a control electrode of the driving transistor; the first gate metal layer further includes the first electrode plate of the storage capacitor, and the first electrode plate of the storage capacitor is also used as the control electrode of the driving transistor; and the second gate metal layer includes the second electrode plate of the storage capacitor, and the first shielding layer is electrically connected to the second electrode plate of the storage capacitor.

10. The array substrate according to claim 9, wherein the first shielding layer and the second electrode plate of the storage capacitor are in the same layer.

11. The array substrate according to claim 9, wherein the second gate metal layer further includes a first auxiliary connection portion; an end of the first auxiliary connection portion is electrically connected to the second electrode plate of the storage capacitor, and another end of the first auxiliary connection portion is electrically connected to the first shielding pattern; and an orthographic projection of the first auxiliary connection portion on the substrate is non-overlapping with an orthographic projection of a control electrode of the compensation transistor on the substrate.

12. The array substrate according to claim 11, wherein the orthographic projection of the first auxiliary connection portion on the substrate is non-overlapping with an orthographic projection of a second electrode of the compensation transistor on the substrate.

13. The array substrate according to claim 1, wherein the first shielding layer further includes a second shielding pattern, and an orthographic projection of the second shielding pattern on the substrate overlaps with an orthographic projection of the second conductive connection portion on the substrate.

14. The array substrate according to claim 2, wherein the compensation transistor is a dual-gate transistor, and the control electrode of the compensation transistor includes a first control electrode and a second control electrode;

the first gate metal layer includes a first conductive pattern, and the first conductive pattern includes the first control electrode and the second control electrode of the compensation transistor; and the semiconductor layer includes a first channel portion and a second channel portion of the compensation transistor, and the semiconductor layer further includes a second auxiliary connection portion; an end of the second auxiliary connection portion is electrically connected to the first channel portion of the compensation transistor, and another end of the second auxiliary connection portion is electrically connected to the second channel portion of the compensation transistor.

15. The array substrate according to claim 14, wherein the first shielding layer further includes a third shielding pattern, and an orthographic projection of the third shielding pattern on the substrate overlaps with an orthographic projection of the second auxiliary connection portion on the substrate.

16. The array substrate according to claim 15, wherein the orthographic projection of the third shielding pattern on the substrate is non-overlapping with orthographic projections of the first control electrode and the second control electrode of the compensation transistor on the substrate.

17. The array substrate according to claim 14, wherein the first conductive pattern further includes a third auxiliary connection portion, and the third auxiliary connection portion is located on a side of the first control electrode and the second control electrode of the compensation transistor away from the driving transistor; and an end of the third auxiliary connection portion is electrically connected to both the first control electrode and the second control electrode of the compensation transistor, and another end of the third auxiliary connection portion is electrically connected to the second scan signal line.

18. The array substrate according to claim 1, wherein the pixel driving circuit further includes:

a first light-emitting control transistor, wherein a first electrode of the first light-emitting control transistor is electrically connected to a first power supply signal line, a second electrode of the first light-emitting control transistor is electrically connected to the first electrode of the driving transistor, and a control electrode of the first light-emitting control transistor is electrically connected to a first enable signal line;

a second light-emitting control transistor, wherein a first electrode of the second light-emitting control transistor is electrically connected to a second electrode of the driving transistor, a second electrode of the second light-emitting control transistor is electrically connected to an output terminal of the pixel driving circuit, and a control electrode of the second light-emitting control transistor is electrically connected to a second enable signal line; and in the column direction, the first light-emitting control transistor is located between the driving transistor and the second light-emitting control transistor.

19. The array substrate according to claim 1, further comprising:

a bottom shielding layer located between the substrate and the pixel driving circuit, wherein an orthographic projection of the bottom shielding layer on the substrate covers an orthographic projection of the driving transistor on the substrate.

20. A display panel, comprising:

the array substrate according to claim 1; and a light-emitting device layer located on a side of the array substrate away from the substrate, wherein the light-emitting device layer includes a plurality of light-emitting devices, and a light-emitting device is electrically connected to the pixel driving circuit.

* * * * *